US010510801B2

United States Patent
Sato et al.

(10) Patent No.: US 10,510,801 B2
(45) Date of Patent: Dec. 17, 2019

(54) IMAGE DISPLAY DEVICE WITH QUANTUM DOT

(71) Applicant: Japan Display Inc., Tokyo (JP)

(72) Inventors: Toshihiro Sato, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 364 days.

(21) Appl. No.: 15/514,159

(22) PCT Filed: Aug. 21, 2015

(86) PCT No.: PCT/JP2015/073558
§ 371 (c)(1),
(2) Date: Mar. 24, 2017

(87) PCT Pub. No.: WO2016/051992
PCT Pub. Date: Apr. 7, 2016

(65) Prior Publication Data
US 2017/0278894 A1    Sep. 28, 2017

(30) Foreign Application Priority Data

Oct. 3, 2014    (JP) ................................ 2014-204627

(51) Int. Cl.
*H01L 27/15*    (2006.01)
*H01L 27/32*    (2006.01)
(Continued)

(52) U.S. Cl.
CPC .............. *H01L 27/156* (2013.01); *G09F 9/33* (2013.01); *G09G 3/32* (2013.01); *G09G 3/3233* (2013.01);
(Continued)

(58) Field of Classification Search
CPC ............... H01L 27/3209; H01L 27/156; H01L 27/3211; H01L 51/502
See application file for complete search history.

(56) References Cited

U.S. PATENT DOCUMENTS

2006/0033426 A1* 2/2006 Chao ................... H01L 27/3209
313/504
2007/0257609 A1 11/2007 Fukuda et al.
(Continued)

FOREIGN PATENT DOCUMENTS

| CN | 101810053 A | 8/2010 |
|---|---|---|
| GB | 2465730 A | 6/2010 |

(Continued)

OTHER PUBLICATIONS

Written Opinion dated Nov. 17, 2015 for the International Searching Authority for PCT application No. PCT/JP2015/073558, With English Translation.
(Continued)

*Primary Examiner* — Laurence J Lee
(74) *Attorney, Agent, or Firm* — Michael Best & Friedrich LLP

(57) ABSTRACT

It is an object of the present invention to provide an image display device in which it is possible to adjust the spectrum of light emitted by pixels and adjust the chromaticity of the light emitted by the pixels. Provided is an image display device having a pixel region in which each pixel comprises a plurality of subpixels and the pixels are arranged in a matrix, wherein each of the subpixels includes a plurality of light-emitting layers overlapping each other with an electrode sandwiched therebetween, and the plurality of light-emitting layers each contain a quantum dot material and have different peak emission wavelengths from each other.

18 Claims, 19 Drawing Sheets

(51) Int. Cl.
  *G09F 9/33* (2006.01)
  *G09G 3/32* (2016.01)
  *H01L 33/06* (2010.01)
  *H01L 51/50* (2006.01)
  *G09G 3/3233* (2016.01)
  *H05B 33/14* (2006.01)

(52) U.S. Cl.
  CPC ............ *H01L 27/32* (2013.01); *H01L 27/322* (2013.01); *H01L 27/3209* (2013.01); *H01L 27/3211* (2013.01); *H01L 27/3248* (2013.01); *H01L 33/06* (2013.01); *H01L 51/502* (2013.01); *H05B 33/145* (2013.01); *G09G 2300/0452* (2013.01); *G09G 2300/0804* (2013.01); *G09G 2300/0842* (2013.01); *G09G 2320/0666* (2013.01)

(56) References Cited

U.S. PATENT DOCUMENTS

| | | | |
|---|---|---|---|
| 2008/0217602 A1 | 9/2008 | Kahen | |
| 2008/0238299 A1* | 10/2008 | Cho | B82Y 20/00 313/503 |
| 2009/0261715 A1 | 10/2009 | Sung et al. | |
| 2010/0244062 A1* | 9/2010 | Ueno | B82Y 20/00 257/90 |
| 2011/0220869 A1 | 9/2011 | Cho et al. | |
| 2013/0146853 A1 | 6/2013 | Lee et al. | |

FOREIGN PATENT DOCUMENTS

| | | |
|---|---|---|
| JP | 2007-294404 A | 11/2007 |
| JP | 2008-177168 A | 7/2008 |
| JP | 2009-087784 A | 4/2009 |
| JP | 2010-009995 A | 1/2010 |
| JP | 2010-033838 A | 2/2010 |
| JP | 2010-520603 A | 6/2010 |
| JP | 2012-146689 A | 8/2012 |
| JP | 2014-078382 A | 5/2014 |
| KR | 10-2008-0069085 A | 7/2008 |
| KR | 10-2009-0111634 A | 10/2009 |
| KR | 10-2010-0081978 A | 7/2010 |
| KR | 10-2013-0029310 A | 3/2013 |
| KR | 10-2013-0064949 A | 6/2013 |
| WO | 2009/041690 A1 | 4/2009 |

OTHER PUBLICATIONS

Korean Office Action dated Apr. 4, 2019 for the corresponding Korean application No. 10-2017-7005900, with partial English machine translation.
Korean office Action dated May 21, 2018 for the corresponding Korean application No. 10-2017-7005900 with Partial English Translation.
Chinese Office Action dated Jun. 27, 2018 for the corresponding Chinese application No. 20158047219.X with Partial English Translation.
Korean Office Action dated Nov. 1, 2018 for the corresponding Korean application No. 10-2017-7005900, with partial English machine translation.
International Search Report dated Nov. 17, 2015, for PCT Application No. PCT/JP2015/073558.
Korean Office Action dated May 17, 2019 for the corresponding Korean application No. 10-2017-7005900. With Partial English Machine Translation.

* cited by examiner

IMAGE DISPLAY DEVICE WITH QUANTUM DOT

CROSS-REFERENCE TO RELATED APPLICATIONS

This application is entering into the National Phase of PCT Application No. PCT/JP/2015/073558, filed on Aug. 21, 2015, which claims priority from Japanese Patent Application No. 2014-204627, filed on Oct. 3, 2014 with the Japanese Patent Office, the entire contents of which are incorporated by reference into this application.

TECHNICAL FIELD

The present invention relates to an image display device whose pixels are constituted by a light-emitting element containing quantum dots and, in particular, to the configuration and placement of the light-emitting element in the pixels.

BACKGROUND

Attention is currently focused on technologies for applying nanoscale luminescent materials called quantum dots to displays. Quantum dots are types of semiconductor materials, only several nanometers in size, constituted by groups of elements such as the II-VI group, the III-V group, and the IV-VI group. When seen as luminescent materials, quantum dots are similar in property to conventional organic electroluminescence materials in that they emit light if they are irradiated with rays of energy (ultraviolet light, blue light) or electric fields are applied to them.

It is known that whereas organic electroluminescence materials have their emission wavelengths controlled by combinations of host materials and guest materials, quantum dots have emission wavelengths that vary according to the material and the dots' size. Expectations are placed on quantum dots because of their advantages of being higher in light emission efficiency than organic electroluminescence materials and, furthermore, being free of concentration quenching.

Disclosed as an example of a quantum dot-based display device is a light-emitting element including, on a transparent substrate, a translucent first electrode, a second electrode opposed to the first electrode, and a polycrystalline inorganic light-emitting layer containing quantum dots in an inorganic semiconductor matrix (see PTL 1). Further disclosed is a method for manufacturing a quantum dot organic electroluminescence element, including: forming a first electrode layer on a substrate; forming a quantum dot template film including a plurality of nanometer sized through-holes from a phase-separable block copolymer film on the first electrode layer; and forming, in each of the through-holes in the quantum dot template film, a quantum dot structure including an organic light-emitting layer (see PTL 2).

CITATION LIST

Patent Literature

PTL 1: Japanese Patent Application Laid-Open No. 2010-520603

PTL 2: Japanese Patent Application Laid-Open No. 2012-146689

SUMMARY OF INVENTION

Technical Problem

According to PTL 1, a light-emitting element is fabricated by applying a colloidal dispersion liquid of quantum dots and semiconductor matrix nanoparticles onto a substrate by drop casting or spin casting to form a layer that is to serve as a light-emitting layer and, furthermore, annealing the layer. This light-emitting element simply includes a quantum dot-containing light-emitting layer in place of a conventional light-emitting layer made of an organic electroluminescence material. Moreover, PTL 1 makes no mention of complexing the light-emitting layer to make it emit white light.

Meanwhile, the organic electroluminescence element disclosed in PTL 2 has its light-emitting layer in the form of an assembly of minute columns. However, this light-emitting element requires a quantum dot template film for the fabrication of the light-emitting layer, resulting in complicated manufacturing processes, and by extension in increased manufacturing costs. Thus, in view of the conventional technologies, it is problematic that, in spite of attention focused on the properties of quantum dots, no display devices have been developed which take full advantage of the features of quantum dots.

It is therefore an object of an embodiment of the present invention to provide a display device of a novel quantum dot-based structure. Further, it is an object of an embodiment of the present invention to provide an image display device that makes it possible to adjust the spectrum of light that is emitted from pixels and can adjust the chromaticity of light that is emitted from the pixels.

Solution to Problems

An embodiment of the present invention provides an image display device including a pixel region where pixels each including a plurality of subpixels are two-dimensionally arrayed, wherein each of the subpixels includes a plurality of light-emitting layers overlapping each other with an electrode sandwiched therebetween, and the plurality of light-emitting layers each contain a quantum dot material and have different peak emission wavelengths from each other.

An embodiment of the present invention provides an image display device including a pixel region where pixels each including a plurality of subpixels are two-dimensionally arrayed, wherein at least one of the subpixels includes a plurality of light-emitting layers placed side by side, and the plurality of light-emitting layers each contain a quantum dot material and have different peak emission wavelengths from each other.

DESCRIPTION OF EMBODIMENTS

Figure 1:
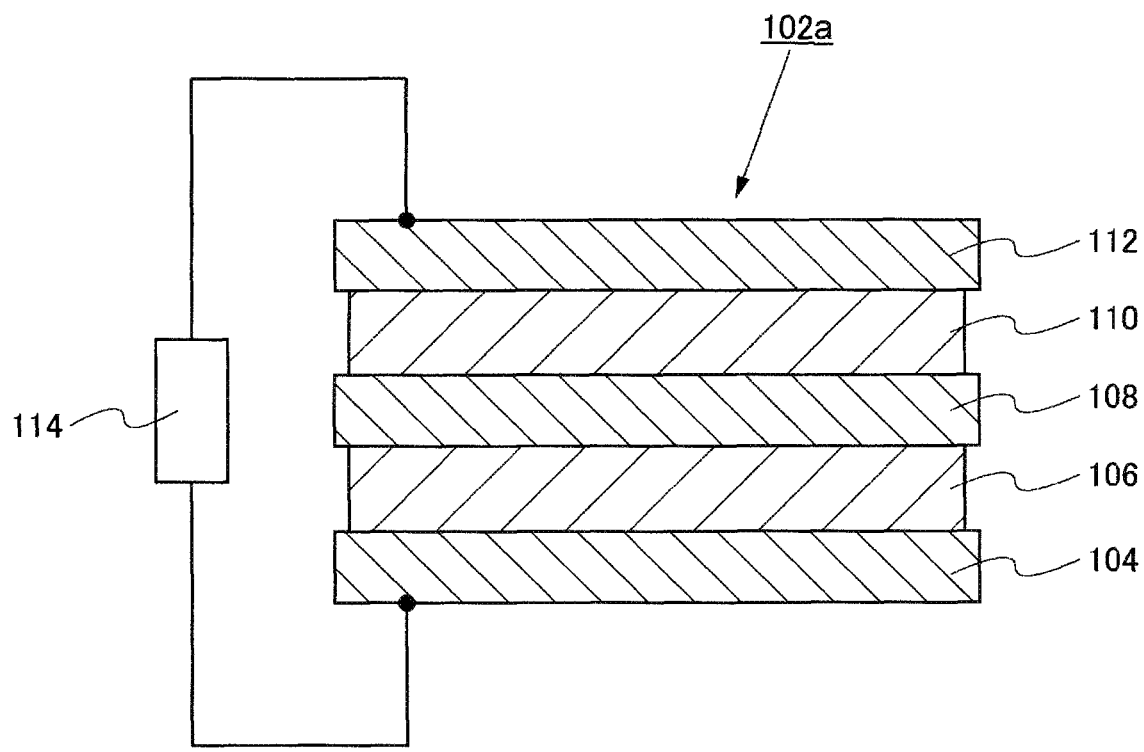
FIG. 1 is a diagram illustrating a configuration of a light-emitting element according to an embodiment of the present invention.

Embodiments of the present invention will be described below with reference to the accompanying drawings and the like. Note, however, that the present invention can be carried out in many different aspects and should not be interpreted by only the written contents of embodiments exemplified below. In addition, for the sake of clearer explanation, the drawings sometimes show each portion more schematically than in actual aspects in terms of width, thickness, shape, and the like. However, each drawing shows merely an example and should not limit the interpretation of the present invention. Furthermore, in this specification and the drawings, the same reference numerals denote the same elements as those described with reference to preceding drawings, and a detailed description will be appropriately omitted.

In this specification, a case in which a given member or region is located "on (or under)" another member or region includes not only a case in which a given member or region is located immediately above (or immediately below) another member or region but also a case in which a given member or region is located above (or below) another member of region, unless otherwise specified. That is, this case also includes a case in which another constituent element is located above (or below) another member or region so as to be included between a given member or region and another member or region.

First Embodiment

The present embodiment shows an aspect of a light-emitting element having a plurality of light-emitting layers stacked in a longitudinal direction (vertical direction) and an image display device whose pixels are constituted by the light-emitting element.

<Structure of Light-Emitting Element>

FIG. 1 shows a configuration of a light-emitting element 102a constituting pixels of an image display device according to an embodiment of the present invention. The light-emitting element 102a includes a plurality of light-emitting layers. Each of the light-emitting layers is sandwiched between electrodes. As shown in FIG. 1, the light-emitting element 102a has a structure in which two light-emitting layers are sandwiched between three electrodes. Specifically, the light-emitting element 102a has a structure in which a first light-emitting layer 106 is sandwiched between a first electrode 104 and a second electrode 108 and a second light-emitting layer 110 is sandwiched between the second electrode 108 and a third electrode 112. Since the first light-emitting layer 106 and the second light-emitting layer 110 are stacked with the second electrode 108 sandwiched therebetween, the second electrode 108 can be deemed to be shared by the two light-emitting layers located thereon and thereunder.

A light-emitting element can control an emission intensity according to a potential difference between electrodes between which a light-emitting layer is sandwiched. The light-emitting element 102a shown in FIG. 1, in which the first electrode 104 and the third electrode 112 are connected to a driving power source 114 but the first electrode 104, the second electrode 108, and the third electrode 112 are separate from one another, can control the emission intensities of the two light-emitting layers according to potential differences among these three electrodes. That is, the emission intensity of the first light-emitting layer 106 is controlled according to the potential difference between the first electrode 104 and the second electrode 108, and the emission intensity of the second light-emitting layer 110 is controlled according to the potential difference between the second electrode 108 and the third electrode 112.

This light-emitting element 102a can be deemed to be a structure in which a first light-emitting cell constituted by the first electrode 104, the first light-emitting layer 106, and the second electrode 108 and a second light-emitting cell constituted by the second electrode 108, the second light-emitting layer 110, and the third electrode 112 are connected in series to each other.

Thus, in a light-emitting element including a plurality of light-emitting layers, the plurality of light-emitting layers are alternately stacked, and electrodes are interposed between each of the light-emitting layers and the other. This makes it possible to individually control the emission intensities of the light-emitting layers.

The direction in which the light-emitting element 102a emits light can be determined by the configuration of electrodes. For example, when the light-emitting element 102a is configured such that the second electrode 108 is a translucent electrode, one of the first and third electrodes 104 and 112 is a translucent electrode, and the other one of the first and third electrodes 104 and 112 is a light-reflecting electrode, light emitted by the first and second light-emitting layers 106 and 110 exits from a surface of that one of the first and third electrodes 104 and 112 which is a translucent electrode. Specifically, if the first electrode 104 is a light-reflecting electrode and the second and third electrodes 108 and 112 are optically transparent electrodes, the light emitted by the first and second light-emitting layers 106 and 110 exits from the third electrode 112.

The light-reflecting electrode is made of a metal material. A preferred example of the metal material is a metal material, such as aluminum (Al) or silver (Ag), which has a high reflectivity with respect to light in a visible light range. Without being limited to the single-element metals named above, the metal material may be any of various alloy materials such as aluminum-titanium, a metal nitride such as titanium nitride, or the like. Further, without being limited to a single layer made of a metal material, the light-reflecting electrode may be formed by stacking a plurality of conducting coats. For example, the light-reflecting electrode may be provided with a light-reflecting surface by a stacked structure being created by providing a transparent conductive film of tin-oxide-containing indium tin oxide (ITO) or the like as the uppermost surface and providing such a metal layer under the transparent conductive film.

The optically transparent electrodes may each be made of a conductive metal oxide such as tin-oxide-containing indium tin oxide (ITO) or indium zinc oxide (IZO). Further, the optically transparent electrodes may each be formed by a metal thin film having such a thickness (of approximately 100 nm or smaller) as to transmit light.

One or both of the first light-emitting layer 106 and second light-emitting layer contain(s) quantum dots. A light-emitting layer containing quantum dots may take any of various forms. For example, a light-emitting layer may be formed by an assembly of quantum dots, or quantum dots may be dispersed in a host material made of an inorganic or organic semiconductor. Alternatively, a quantum dot-containing light-emitting layer may be sandwiched between carrier injection and transport layers such as a hole or electron injection layer and a hole or electron transport layer.

The quantum dots may be made of any of various materials. Usable examples of the quantum dots are fine particles of a compound semiconductor or an oxide semiconductor several nanometers to several tens of nanometers in size. Examples of such fine particles include those of a II-VI group semiconductor (such as CdSe, CdS, CdTe, ZnO, ZnS, ZnTe, HgS, HgTe, or CdZnSe), those of a III-V group semiconductor (such as InAs, InP, InN, GaN, InSb, InAsP, InGaAs, GaAs, GaP, AlP, AlN, AlSb, CdSeTe, or ZnCdSe), those of a IV-VI semiconductor (such as PbSe, PbTe, PbS, PbSnTe, $Tl_2SnTe_5$), and the like. Alternatively, the quantum dots may be those of a IV group semiconductor. A usable example is graphene, in which six-membered rings of carbon atoms of a single-atom layer of carbon atoms are two-dimensionally arrayed in a row.

Each of the quantum dots may be of a structure having only a core part serving as a light-emitting part or of a core-shell structure having a shell part surrounding the core part. Alternatively, each of the quantum dots may be of a multi-shell structure such as a shell-core-shell structure. It should be noted that the shell is a substance that is provided to enhance the function of confining electrons and holes into the core part. It is preferable that the shell be a substance that is higher in band gap energy than the core part. This shell part causes a loss of electrons and holes due to a non-radiation transition to be reduced, making it possible to improve the light emission efficiency.

Such a quantum dot-containing light-emitting layer can be fabricated by any of various manufacturing methods. For example, a quantum dot-containing light-emitting layer can be fabricated by a solution thin-film deposition technique such as a spin-casting method or a drop-casting method.

The emission mechanism of a quantum dot-based light-emitting layer is complex but can be explained by a model of a quantum well. When explained in terms of an energy band model, it is conceivable that the quantum dots may form a localized level in the light-emitting layer and this localized level may form a quantum well. At this point in time, the quantum well acts as the luminescence center in the light-emitting layer. That is, a mechanism is conceivable in which the quantum dots emit light by trapping carriers injected into the light-emitting layer and releasing photons in the process of recombination of the trapped carriers.

Quantum dots give off light that can be controlled, i.e. have emission wavelengths that can be controlled, according to the composition of the material and the particles' size. Therefore, dispersing quantum dots of uniform particle size in a light-emitting layer makes it possible to emit light with a sharp spectral peak and high color purity. In other words, varying the composition of the material and the particle size makes it possible to emit light with different peak emission wavelengths.

In the present embodiment, although the first light-emitting layer 106 and the second light-emitting layer 110 may be constituted by quantum dots of the same material and particle size, it is preferable that the first light-emitting layer 106 and the second light-emitting layer 110 use different quantum dots from each other to have different bands of emission wavelengths. For example, by the first light-emitting layer 106 emitting blue light with a peak emission wavelength which is from 435 nm to 480 nm and the second light-emitting layer 110 emitting yellow light with a peak emission wavelength which is from 580 nm to 595 nm or emitting green light with a peak emission wavelength which is from 500 nm to 560 nm and red light with a peak emission wavelength which is from 610 nm to 750 nm, the light-emitting element 102a can emit white light or light that appears to be close to white light.

It should be noted that the emission from a light-emitting element of white light or a spectrum of light that is close to white light may alternatively be achieved by replacing the two light-emitting layers with three light-emitting layers, namely light-emitting layer corresponding to blue light, a light-emitting layer corresponding to green light, and a light-emitting layer corresponding to red light, stacked so that each of the light-emitting layers is sandwiched between electrodes as in the structure shown in FIG. 1.

The first light-emitting layer 106 needs only have such a thickness as to emit light at the intensity of an electric field that is formed by the first electrode 104 and the second electrode 108 and, for example, can be formed with a thickness of 100 nm to 1000 nm. The same applies to the second light-emitting layer 110 sandwiched between the second electrode 108 and the third electrode 112.

FIG. 1 shows an aspect in which a bias is applied between the first electrode 104 and the third electrode 112. At this point in time, the second electrode 108 may have a floating potential, or the potential of the second electrode 108 may be separately controlled. When the second electrode 108 is floating, the first light-emitting layer 106 and the second light-emitting layer 110 can be made to emit light on the basis of a potential difference between the first electrode 104 and the third electrode 112, and when the potential of the second electrode 108 is controlled, the emission intensities of the first light-emitting layer 106 and the second light-emitting layer 110 can be individually controlled. In a case where the first light-emitting layer 106 and the second light-emitting layer 110 have different emission spectra, the color tone of light that is emitted from the light-emitting element 102 can be adjusted by individually controlling the respective emission intensities. For example, the color tone of light that is emitted from the light-emitting element 102 can be adjusted even when the light can be deemed to be apparent white light like reddish white light or bluish white light.

The light-emitting element 102a shown in FIG. 1, in which the first light-emitting layer 106 and the second light-emitting layer 110 are connected in series to each other to form a single current path, can emit light with a current that is smaller than that with which two light-emitting elements individually emit light. Further, the formation of the first and second light-emitting layers 106 and 110 from quantum dots makes it possible to emit light with high color purity or give off white light with high color purity and sufficient luminance.

<Overall Configuration of Image Display Device>

Figure 2:
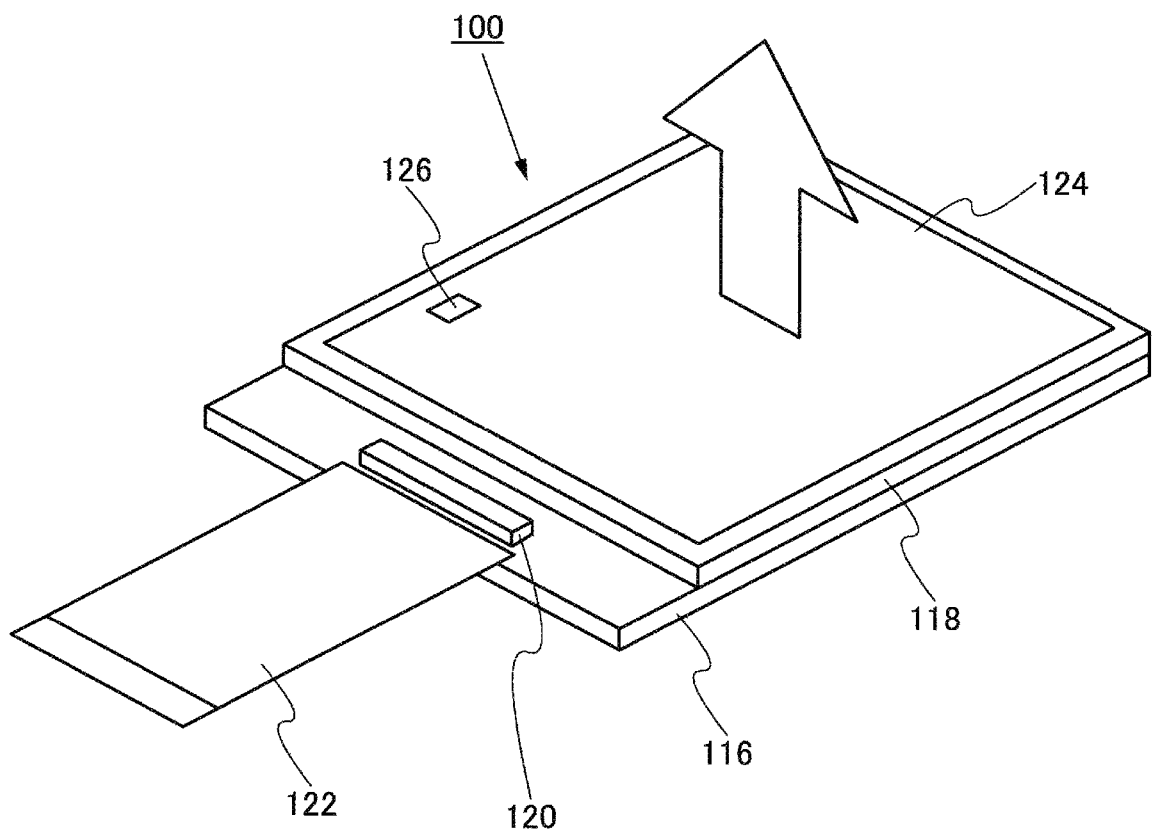
FIG. 2 is a perspective view illustrating a configuration of an image display device according to the embodiment of the present invention.

FIG. 2 shows an aspect of an image display device 100 according to the embodiment of the present invention. The image display device 100 includes a pixel unit 124 constituted by an array of pixels 126 to provide an image display screen. An element substrate 116 is provided with the pixels 126 by active elements such as the light-emitting element and transistors, and the pixel unit 124 has its upper surface covered with a sealant 118. The element substrate 116 may also be provided with a driver circuit 120 that outputs signals under control of which the pixels 126 operate. Further, the element substrate 116 may also be mounted with a flexible printed wiring board 122 for connecting to an external circuit.

<Configuration of Pixels>

A configuration of each of the pixels of the image display device according to the present embodiment is described with reference to FIG. 3 and FIG. 4. In the present embodiment, each of the pixels includes a plurality of subpixels.

Figure 3:
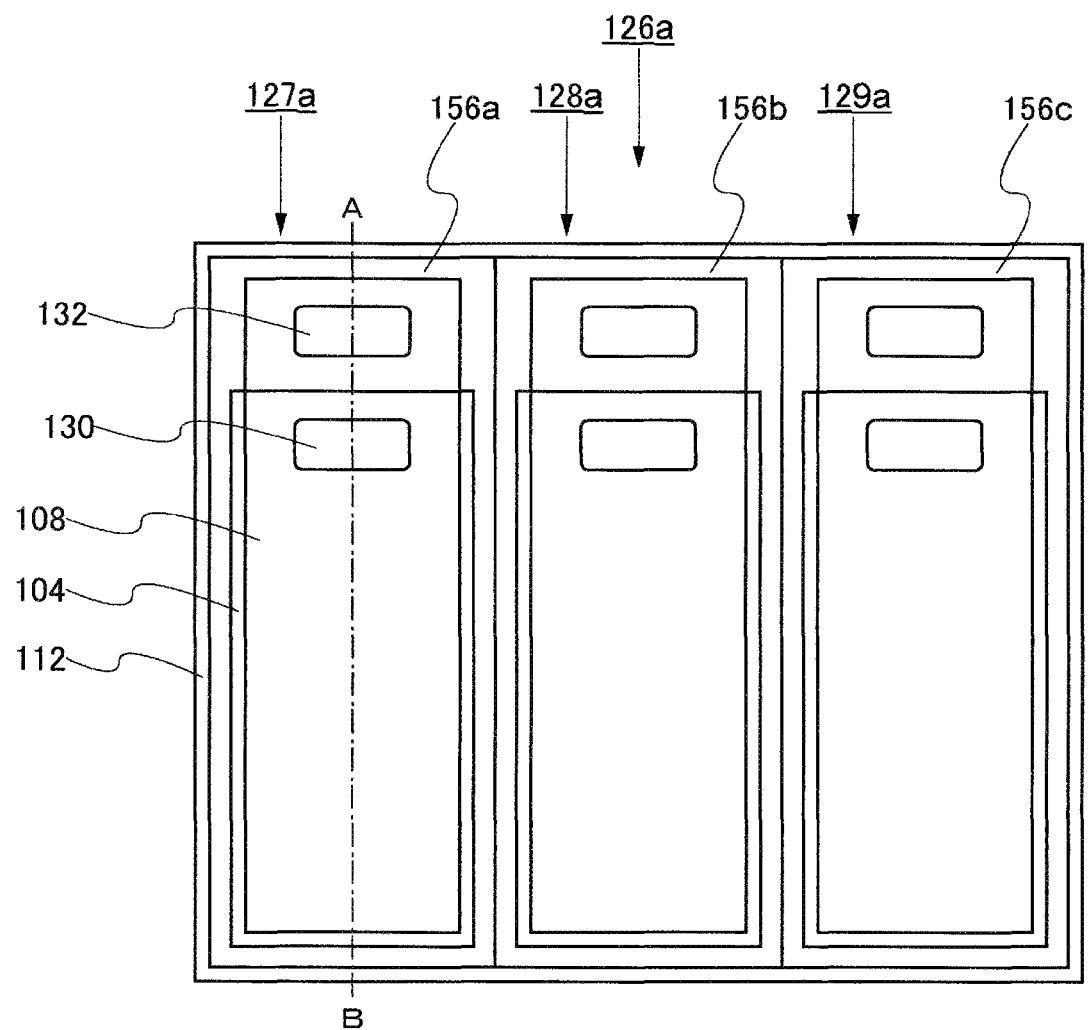
FIG. 3 is a diagram showing a configuration of a pixel of the image display device according to the embodiment of the present invention.

FIG. 3 shows a configuration of a single pixel 126a including a first subpixel 127a, a second subpixel 128a, and a third subpixel 129a. For example, the first subpixel 127a, the second subpixel 128a, and the third subpixel 129a may be subpixels that correspond to the colors of red, green, and blue, respectively. Instead of including only subpixels that correspond to these colors, each pixel may additionally include a subpixel that corresponds to a neutral tint between the aforementioned colors or a subpixel that corresponds to the color of white. A color display can be achieved by each pixel thus including a plurality of subpixels that emit different colors of light.

Figure 4:
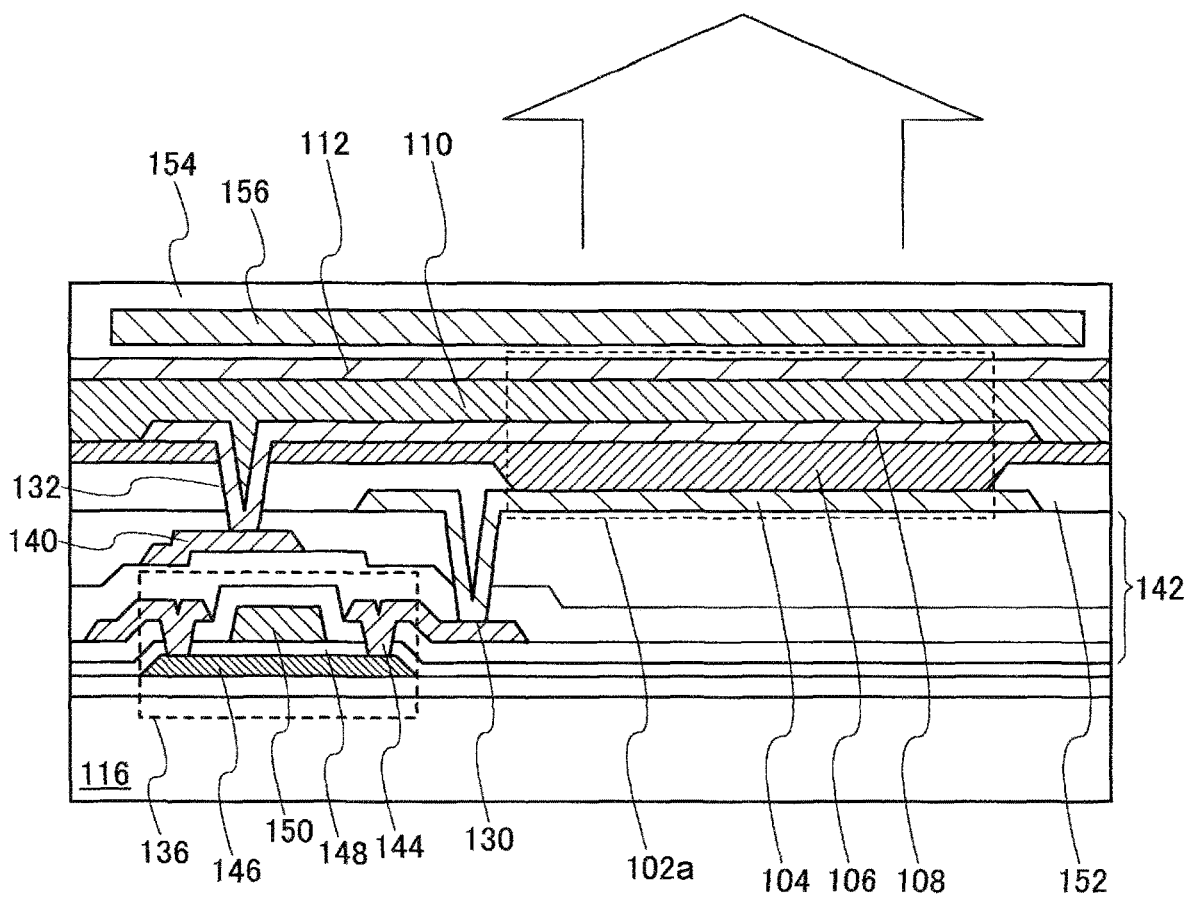
FIG. 4 is a cross-sectional view showing the configuration of the pixel of the image display device according to the embodiment of the present invention.

FIG. 4 is a diagram illustrating a cross-sectional structure of such a pixel. The cross-sectional structure of the pixel shown in FIG. 4 corresponds to line A-B shown in FIG. 3. The following description refers to both FIGS. 3 and 4.

As shown in FIG. 4, each of the subpixels is configured to include the light-emitting element 102a and a first transistor 136. The light-emitting element 102a, which is identical in configuration to that described with reference to FIG. 1, is configured such that the first electrode 104, the first light-emitting layer 106, the second electrode 108, the second light-emitting layer 110, and the third electrode 112 are stacked. That is, the light-emitting element 102a is configured such that the first light-emitting layer 106 is provided between the first electrode 104 and the second electrode 108 and the second light-emitting layer 110 is provided between the second electrode 108 and the third electrode 112.

The first light-emitting layer 106 and the second light-emitting layer 110 are provided substantially all over a pixel region. Since the first light-emitting layer 106 covers the first electrode 104, the first electrode 104 and the second electrode 108 will not come into direct contact with each other. Similarly, since the second light-emitting layer 110 covers the second electrode 108, the second electrode 108 and the third electrode 112 will not become short-circuited by coming into direct contact with each other. Therefore, as shown in the plan view of FIG. 3, although, in each of the subpixels, the first electrode 104, the second electrode 108, and the third electrode 112 overlap each other, the interposition of the first or second light-emitting layer 106 or 110 therebetween prevents the electrodes from becoming short-circuited by coming into direct contact with each other.

The first electrode 104 is provided as individual electrodes for each separate subpixel and connected to the first transistor 136 at a first contact portion 130. Further, the second electrode 108 is provided as individual electrodes for each separate subpixel and connected to a potential-controlling wire 140 at a second contact portion 132. In the present embodiment, since the first light-emitting layer 106 is made of an inorganic material as mentioned above, the second electrode 108 formed on the upper surface of the first light-emitting layer 106 is not damaged even when a photolithographic microfabrication process is applied. It should be noted that a bank layer 152 may be provided around the outer edge of the first electrode 104, and this bank layer 152 may serve to reduce a step that is formed by the first electrode 104.

Further, instead of being connected to the wire 140, the second electrode 108 may be used as a floating electrode. In this case, there is no need to provide the second contact portion 132 at which the second electrode 108 is connected to the wire 140. This allows the subpixel to have a larger light-emitting effective area, i.e. allows the pixel to have a higher aperture ratio.

The third electrode 112 is provided as a common electrode via which a common potential is supplied to the plurality of subpixels. For that purpose, the third electrode 112 is formed substantially all over the second light-emitting layer 110. Furthermore, a sealing layer 154 is provided on the third electrode 112. The sealing layer 154 can be formed by a translucent organic resin material, a translucent inorganic insulating material, or a combination of a layer made of an organic resin material and a layer made of an inorganic material. The sealing layer 154 also functions as a protective layer and, by being provided on the third electrode 112, can prevent the light-emitting element 102a from being exposed directly to the atmosphere.

FIG. 4 shows a top-emission pixel structure in which the light emitted by the first and second light-emitting layers 106 and 110 exits from a third electrode 112 side. In this configuration, the first electrode 104 is the aforementioned light-reflecting electrode, and the second electrode 108 and the third electrode 112 are optically transparent electrodes.

The light-emitting element 102a has a luminous region where the first electrode 104, the first light-emitting layer 106, the second electrode 108, the second light-emitting layer 110, and the third electrode 112 overlap. The emission from the third electrode 112 side of white light or a spectrum of light that is close to white light can be achieved by causing the first light-emitting layer 106 to serve as a layer that emits light in a blue wavelength band and causing the second light-emitting layer 110 to serve as a layer that emits light in a yellow wavelength band or a red and green wavelength band.

A color filter 156 can be provided over this luminous region. For example, the color filter 156 may be provided in such a manner as to be buried in the sealing layer 154. Note here that providing predetermined color filters 156 that correspond to each separate subpixel allows the imaging display device to perform a color display. FIG. 3 shows color filters 156a, 156b, and 156c that correspond to the first subpixel 127a, the second subpixel 128a, and the third subpixel 129a, respectively.

The color filter 156 is fabricated by the step of applying a coloring layer that transmits light in a predetermined band and patterning the coloring layer. Although the formation of a color filter entails application of chemicals and a water-wash process, the light-emitting layers will not be damaged by these processes, as the light-emitting layers are formed from quantum dots made of an inorganic material. Therefore, the present embodiment makes it possible to provide a color filter above the light-emitting layers. This makes it possible to provide the element substrate 116, on which the light-emitting element 102a is formed, with a color filter, thus making it possible to achieve reductions in thickness and weight of the image display device.

The present embodiment makes it possible to achieve commonality of the configuration of the light-emitting element among the subpixels by providing each subpixel with a plurality of light-emitting layers, emitting white light or light that can be deemed to be pseudo-white light, and providing color filters that correspond to each separate subpixel. That is, the light-emitting layers can be provided as common layers for all subpixels, as there is no need to fabricate light-emitting layers for each separate subpixel. This makes it possible to form the first light-emitting layer 106 and the second light-emitting layer 110 substantially all over the pixel region. Further, the provision of these light-emitting layer substantially all over the pixel region makes it possible to prevent the first electrode 104 and the second electrode 108 from becoming short-circuited and the second electrode 108 and the third electrode 112 from becoming short-circuited.

Furthermore, in the present embodiment, the first light-emitting layer 106 is not damaged even when the second electrode 108 is processed by dry etching or wet etching on the first light-emitting layer 106, as at least the first light-emitting layer 106 is provided by using quantum dots made of an inorganic material. This makes it possible to make finer subpixels by a photolithographic technique.

An interlayer insulating layer is provided between the light-emitting element 102a and the first transistor 136. In FIG. 4, an interlayer insulating layer 142 is provided between the light-emitting element 102a and the first transistor 136. The interlayer insulating layer 142 needs only include a single layer or a plurality of layers. The example shown in FIG. 4 shows an aspect in which the interlayer insulating layer 142 is provided between a gate electrode 150 and a source-drain electrode 144, between the source-drain electrode 144 and the wire 140, and between the wire 140 and the first electrode 104. The first electrode 104 of the light-emitting element 102a is connected to the first transistor 136 at the first contact portion 130. The first contact portion 130 has a contact hole bored through the interlayer insulating layer 142 and is electrically connected to the source-drain electrode 144 of the first transistor 136. Such a configuration in the first subpixel 127a is similar to those in the second subpixel 128a and the third subpixel 129a. Individual control of the emission of light can be achieved by each of the subpixels having its first electrode connected to that subpixel.

The first transistor 136 has a configuration of a field-effect transistor in which a semiconductor layer 146 and the gate electrode 150 are insulated from each other by a gate insulating layer 148. The first transistor 136 takes the form of a thin-film transistor in which the semiconductor layer 146 is made of amorphous or polycrystalline silicon or an oxide semiconductor and a channel is formed in the semiconductor layer 146 by applying a gate voltage to the gate electrode 150.

The present embodiment makes it possible to provide, on the same substrate, transistors and a light-emitting element having a plurality of quantum dot-based light-emitting layers. Reductions in thickness and size of the image display device can be achieved by the transistors forming, on the same substrate, pixel circuits that control the emission of light from each separate pixel and driving circuits that supplies driving signals to the pixels.

Figure 5A:
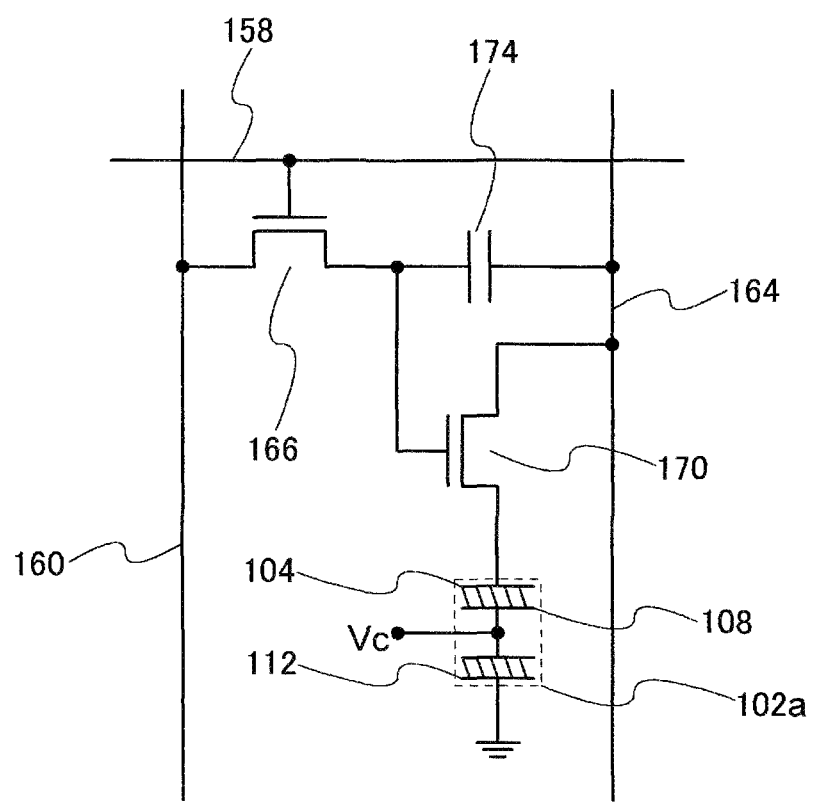
FIG. 5A is a diagram illustrating an example of an equivalent circuit of a pixel of the image display device according to the embodiment of the present invention.
Figure 5B:
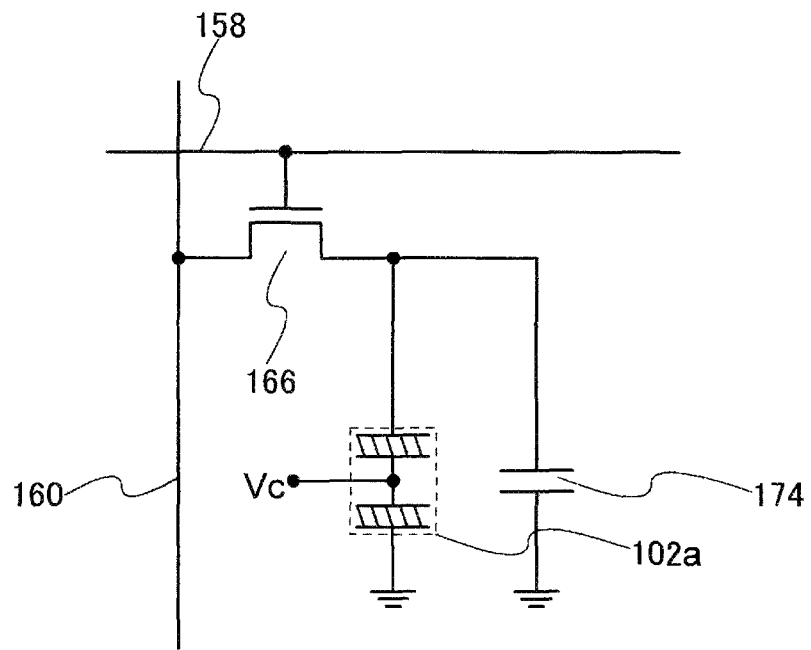
FIG. 5B is a diagram illustrating an example of an equivalent circuit of a pixel of the image display device according to the embodiment of the present invention.

FIG. 5A and FIG. 5B are circuit diagrams showing examples of circuit configurations of pixels, such as that shown in FIG. 4, each of which includes the light-emitting element 102a and a transistor(s).

FIG. 5A shows an example of a pixel circuit including a first selecting transistor 166 that performs a switching operation according to a scanning signal that is supplied to a scanning signal line 158, a first driving transistor 170 whose gate is supplied with a potential based on a video signal that is supplied from a first video signal line 160 by the first selecting transistor 166 being turned on, and the light-emitting element 102a connected to the first driving transistor 170. The first driving transistor 170 is connected between a power source line 164 and the light-emitting element 102a. The first driving transistor 170 shown in FIG. 5A corresponds to the first transistor 136 shown in FIG. 4.

The first driving transistor 170 has its gate potential retained by a first capacitor 174, and a drain current corresponding to the gate potential is supplied to the light-emitting element 102a. FIG. 5A shows an equivalent circuit of a pixel. An explanation of the structure of the light-emitting element 102a in FIG. 5A in association with FIG. 4 shows that the first electrode 104 is connected to the first driving transistor 170 and a common potential is supplied to the third electrode 112. The second electrode 108 located between the first electrode 104 and the third electrode 112 may be supplied with a predetermined control potential (Vc) or be at a floating potential.

The light-emitting element 102a can be deemed to be a capacitive element in which a first capacitive unit formed by the first light-emitting layer 106 sandwiched between the first electrode 104 and the second electrode 108 and a second capacitive unit formed by the second light-emitting layer 110 sandwiched between the second electrode 108 and the third electrode are connected in series to each other. In this case, the supply of the control potential (Vc) to the second electrode 108 makes it possible to control, according to the control potential (Vc), the intensities of electric fields that are supplied to the first light-emitting layer 106 and the second light-emitting layer 110, whereby the emission intensities can be adjusted. Further, in a case where the second electrode 108 is at a floating potential, the second electrode 108 can function as a memory that, when a video signal is supplied to the subpixel, retains a predetermined potential corresponding to the video signal.

FIG. 5B shows an example of a first selecting transistor 166 that performs a switching operation according to a scanning signal that is supplied to a scanning signal line 158 and a pixel circuit in which a potential corresponding to a video signal is supplied to a first capacitor 174 from a first video signal line 160 via the first selecting transistor 166 and charges stored in the first capacitor 174 cause the light-emitting element 102 to emit light. The first selecting transistor 166 shown in FIG. 5B corresponds to the first transistor 136 shown in FIG. 4. The first electrode 104 of the light-emitting element 102a is connected to the first selecting transistor 166 and the first capacitor 174, and a common potential is supplied to the third electrode 112. When a predetermined potential that is higher than the common potential is supplied to the first capacitor 174, the charges flow from the first capacitor 174 into the light-emitting element 102a, so that the light-emitting element 102a emits light. At this point in time, the potential of the second electrode 108 may be the control potential (Vc) or a floating potential as in the case of FIG. 5A. In the circuit of FIG. 5B, the pixel needs only include one transistor, and in the case of top emission, the area of the capacitor can be increased with no influence on the aperture ratio of the pixel. Therefore, the charges stored in the first capacitor 174 allows the light-emitting element 102a to emit light at a sufficient emission intensity.

As described above, by forming light-emitting layers from quantum dots, the present embodiment makes it possible to stack the light-emitting layers with an intermediate electrode sandwiched therebetween. In that case, the second electrode, which corresponds to the intermediate electrode, can serve as an individual electrode in each subpixel. This makes it possible to, by forming a plurality of light-emitting layers from quantum dots between the first electrode and the second electrode and separately providing the second electrode between the light-emitting layers, adjust emission intensities by controlling the intensities of electric fields that are applied to the respective light-emitting layers. Further, since a white light-emitting element can be made by using quantum dots to stack a plurality of light-emitting layers having different emission wavelength bands, a color display can be performed by providing a color filter on a plane of light emission. This eliminates the need to pattern light-emitting layers for each separate pixel (subpixel), thus making it easy to simplify the steps.

Second Embodiment

Figure 6:
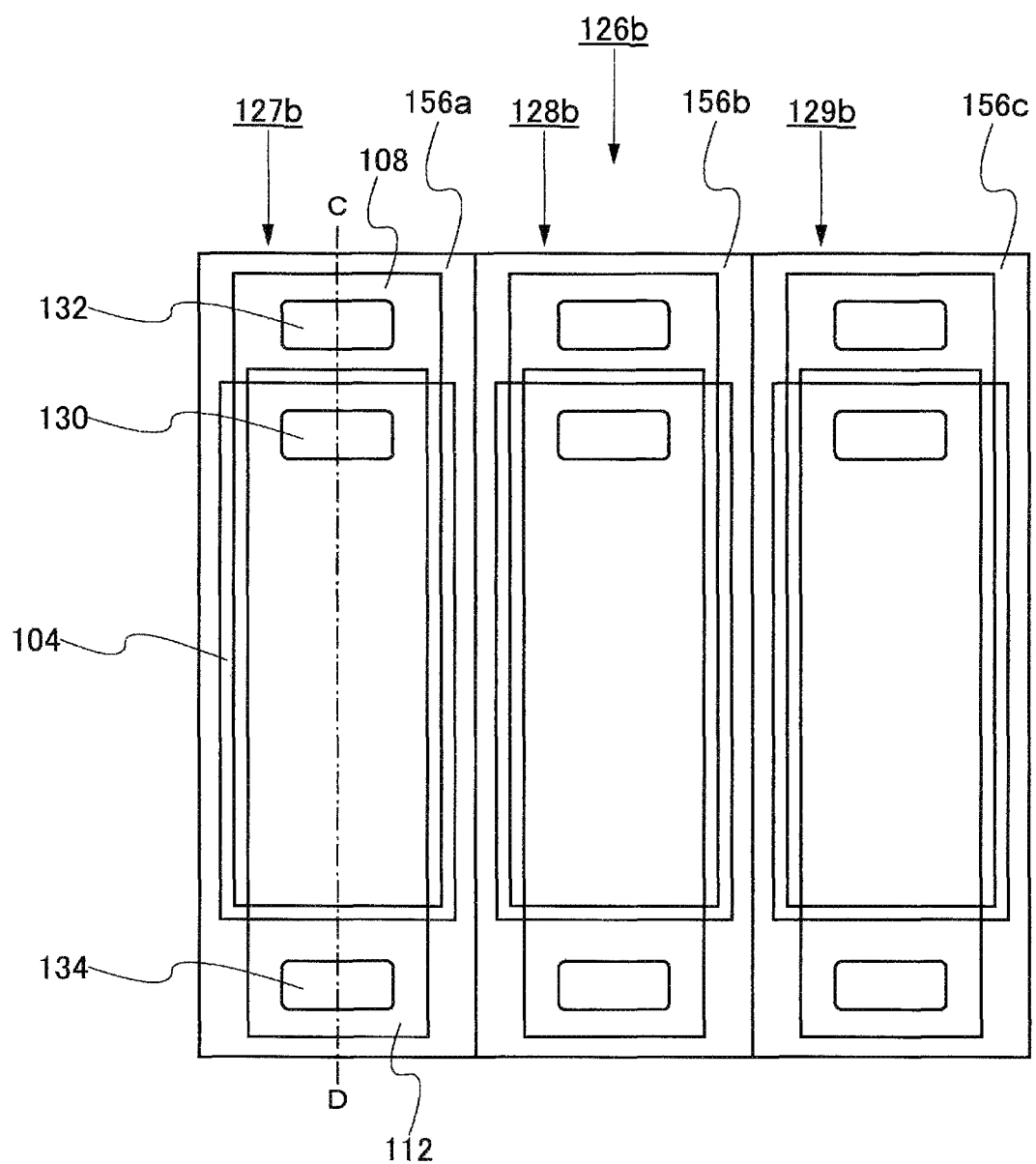
FIG. 6 is a cross-sectional view showing a configuration of a pixel of an image display device according to an embodiment of the present invention.
Figure 7:
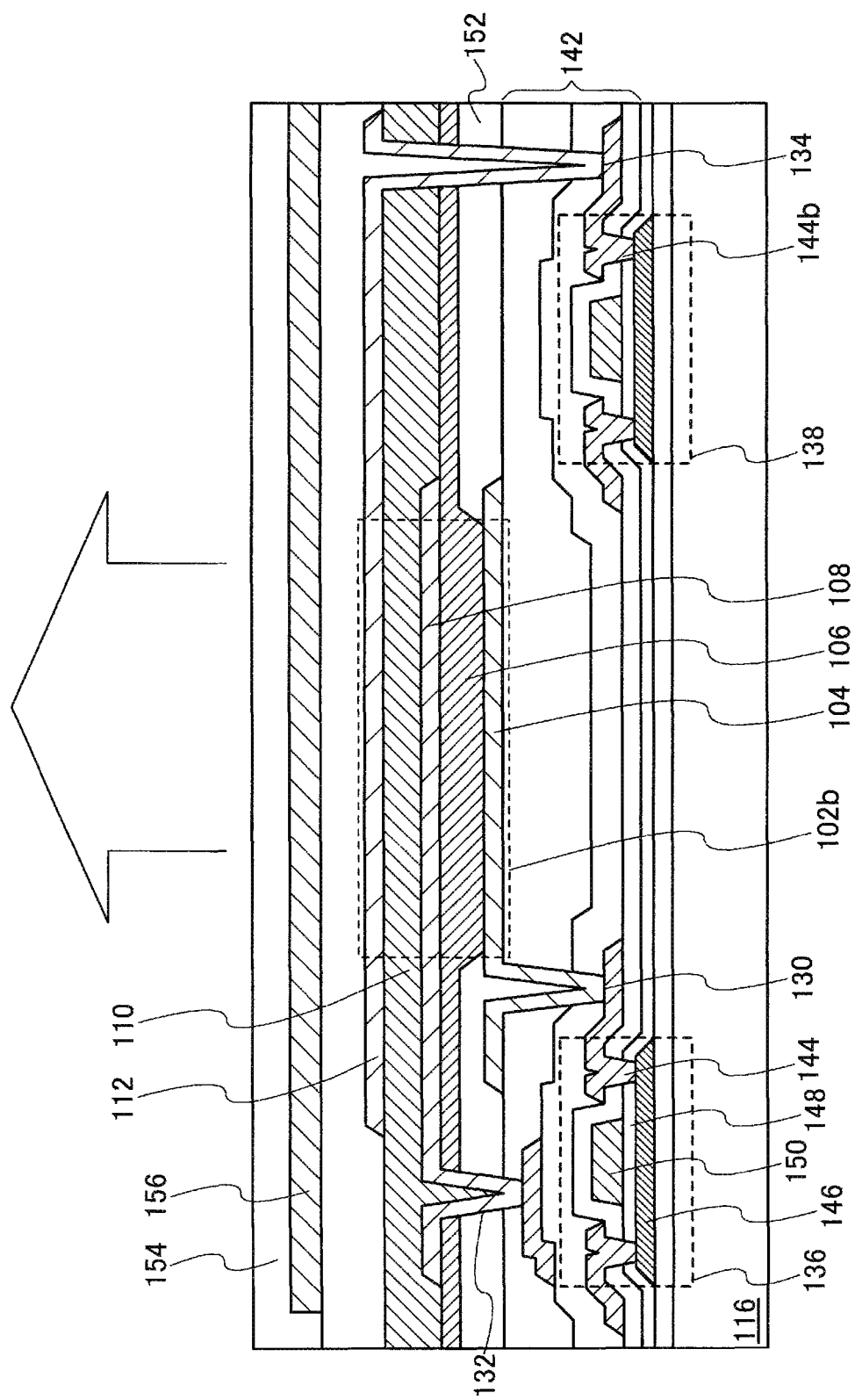
FIG. 7 is a cross-sectional view showing the configuration of the pixel of the image display device according to the embodiment of the present invention.

The present embodiment describes, with reference to FIG. 6 and FIG. 7, a configuration of a subpixel described in the first embodiment in which the potential of the third electrode can also be controlled for each subpixel.
<Configuration of Pixel>
FIG. 6 shows an aspect in which a single pixel 126b includes a first subpixel 127b, a second subpixel 128b, and a third subpixel 129b. For example, the first subpixel 127b, the second subpixel 128b, and the third subpixel 129b may be subpixels that correspond to the colors of red, green, and blue, respectively. Instead of including only subpixels that correspond to these colors, each pixel may additionally include a subpixel that corresponds to a neutral tint between the aforementioned colors or a subpixel that corresponds to the color of white. A color display can be achieved by each pixel thus including a plurality of subpixels that emit different colors of light.

The subpixel 127b is provided with the first electrode 104, the second electrode 108, and the third electrode 112. The first electrode 104, the second electrode 108, and the third electrode 112 are provided as individual electrodes that belong to the first subpixel 127b. The same electrode configuration applies to the second subpixel 128b and the third subpixel 129b. That is, the configuration of the pixels in the present embodiment differs from the configuration of the pixels in the first embodiment in that the third electrode 112 is provided not as a common electrode for all pixels but as individual electrodes that correspond to each separate subpixel.

FIG. 7 is a diagram illustrating a cross-sectional structure of such a pixel. The cross-sectional structure of the pixel shown in FIG. 7 corresponds to line C-D shown in FIG. 6. The following description refers to both FIG. 6 and FIG. 7.

FIG. 7 shows similarities to the first embodiment in that a light-emitting element 102b includes the first electrode 104, the second electrode 108, the third electrode 112, the first light-emitting layer 106, and the second light-emitting layer 110, that the light-emitting element 102b is configured such that the first light-emitting layer 106 is sandwiched between the first electrode 104 and the second electrode 108 and the second light-emitting layer 110 is sandwiched between the second electrode 108 and the third electrode 112, and that the first electrode 104 is connected to the first transistor 136.

In the present embodiment, the third electrode 112 of the first subpixel 127b is connected to a second transistor 138 at a third contact portion 134. The second transistor 138 is identical in configuration to the first transistor 136. The third contact portion 134 has a contact hole bored through the first light-emitting layer 106, the second light-emitting layer 110, the bank layer 152, and the interlayer insulating layer 142. The third electrode 112 is provided on the upper surface of the second light-emitting layer 110 and electrically connected to a source-drain electrode 144b of the second transistor 138 via the contact hole in the third contact portion 134.

In the present embodiment, the contact hole can be formed by dry etching or wet etching, as the first light-emitting layer 106 and the second light-emitting layer 110 are made of an inorganic semiconductor material containing quantum dots. Moreover, the connection of the third electrode 112 of each of the subpixels to the second transistor 138 makes it possible to control the luminance and hue of the light-emitting element 102 by varying the potential of the third electrode 112 from one subpixel to another.

Figure 8:
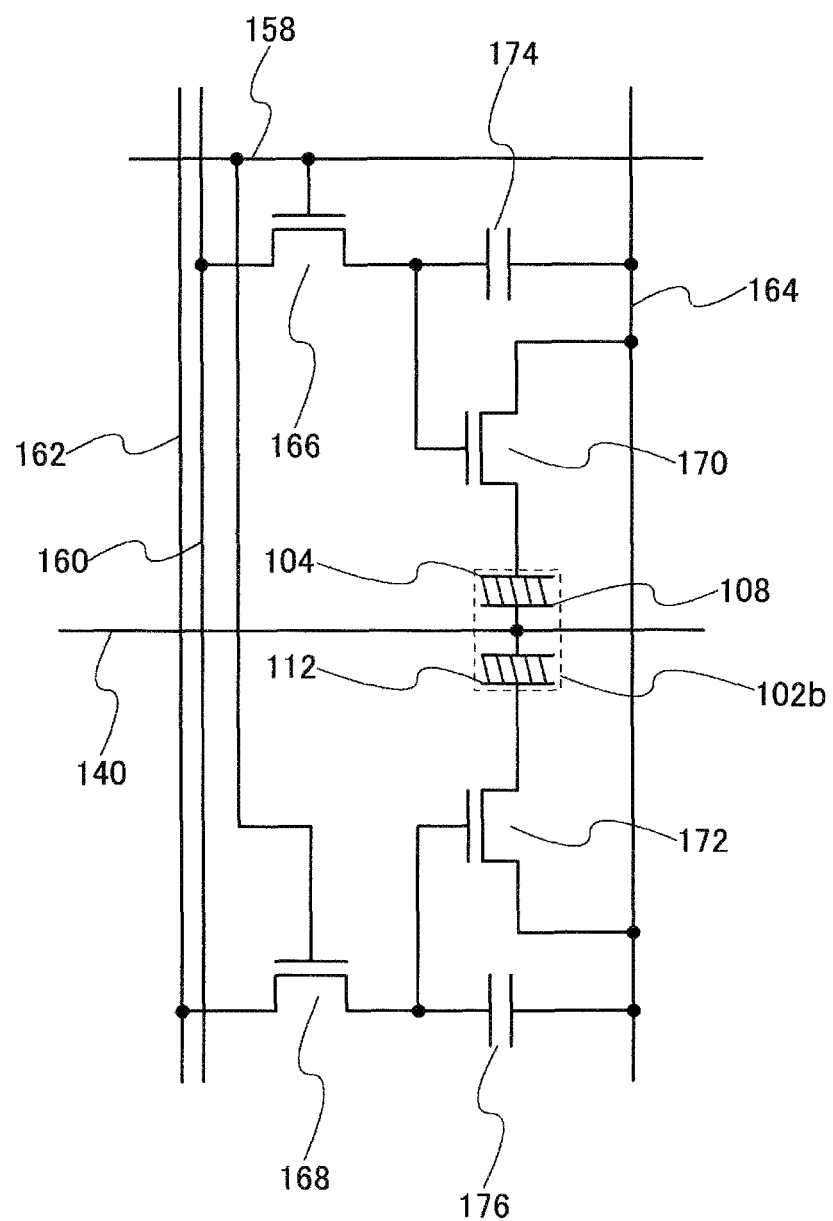
FIG. 8 is a diagram illustrating an example of an equivalent circuit of a pixel of the image display device according to the embodiment of the present invention.

FIG. 8 shows an example of a circuit configuration of a pixel that can be constituted by subpixels configured as shown in FIG. 7.

The circuit shown in FIG. 8 is similar to that shown in FIG. 5A in terms of the connection between the first selecting transistor 166, the first driving transistor 170, the first capacitor 174, and the light-emitting element 102b. The present embodiment includes a second selecting transistor 168, a second driving transistor 172, and a second capacitor 176 in order to control the potential of the third electrode 112 of the light-emitting element 102b.

The second selecting transistor 168 has its gate connected to the scanning signal line 158 and its input terminal connected to a second video signal line 162. The second selecting transistor 168 has its output-side terminal connected to the gate of the second driving transistor 172, and a potential based on a video signal that is supplied to the second video signal line 162 is supplied to the gate of the second driving transistor 172. The second capacitor 176 is charged with this gate potential and functions to retain the gate potential.

The second electrode 108 of the light-emitting element 102*b* is connected to the wire 140. In FIG. 8, a certain potential is supplied to the wire 140. The potential of the wire 140 may be a potential that is commonly supplied to the light-emitting element of each of the subpixels, e.g. a ground potential or a low-level reference potential. The connection of the second electrode 108 to the wire 140, to which a certain common potential is supplied, makes it possible to supply different video signals to the first video signal line 160 and the second video signal line 162. That is, the connection allows the first and third electrodes 104 and 112 of the light-emitting element 102*b* to have different potentials. This allows the first light-emitting layer 106 and the second light-emitting layer 110 to have different emission intensities.

In this case, the first light-emitting layer 106 and the second light-emitting layer 110 have different emission spectra. Therefore, by making it possible to individually control the emission intensities of the first and second light-emitting layers 106 and 110, the synthetic spectrum of light that is emitted from the light-emitting element 102*b* can be changed.

By making it possible to individually control the potentials of the first and third electrodes of the light-emitting element, the present embodiment makes it possible to individually change the emission intensities of the first and second light-emitting layers. This makes it possible to adjust the color tone of light that is emitted from the light-emitting element. It should be noted that since the image display device according to the present embodiment is the same as that according to the first embodiment except that the potential of the third electrode is independently controllable, the present embodiment can bring about working effects which are similar to those brought about by the first embodiment.

Third Embodiment

The present embodiment shows an aspect of a light-emitting element configured such that a plurality of light-emitting layers are arranged in a transverse direction (horizontal direction) and an image display device whose pixels are constituted by the light-emitting element.

<Structure of Light-Emitting Element>

Figure 9:
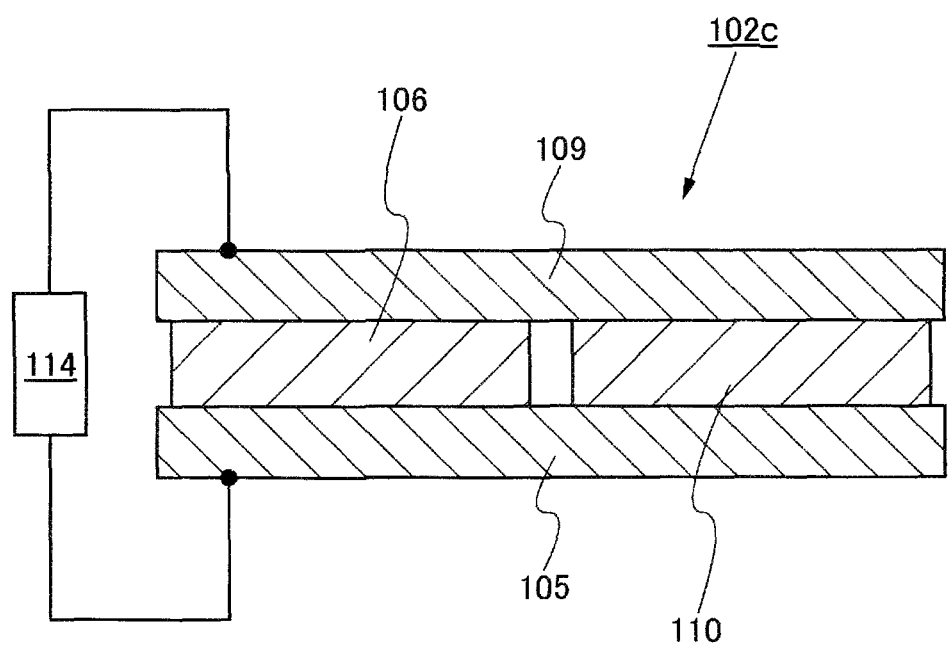
FIG. 9 is a diagram illustrating a configuration of a light-emitting element according to an embodiment of the present invention.

FIG. 9 shows a configuration of a light-emitting element 102*c* constituting pixels of an image display device according to an embodiment of the present invention. The light-emitting element 102*c* has a plurality of light-emitting layers provided between two electrodes. That is, as shown in FIG. 9, the first light-emitting layer 106 and the second light-emitting layer 110 are placed side by side and both sandwiched between a first electrode 105 and a second electrode 109. Since the first light-emitting layer 106 and the second light-emitting layer 110 are placed side by side and both sandwiched between the first electrode 105 and the second electrode 109, it can be deemed that two light-emitting cells connected in parallel to each other.

The light-emitting element 102*c* is configured such that, by connecting the first electrode 105 and the second electrode 109 to the driving power source 114 and supplying a potential difference, the same potential difference is applied to the first light-emitting layer 106 and the second light-emitting layer 110. The first light-emitting layer 106 and the second light-emitting layer 110 emit light when a predetermined potential difference is supplied to them. It should be noted that the first light-emitting layer 106 and the second light-emitting layer 110 are identical in configuration to those described in the first embodiment. That is, by the first light-emitting layer 106 emitting blue light with a peak emission wavelength which is from 435 nm to 480 nm and the second light-emitting layer 110 emitting yellow light with a peak emission wavelength which is from 580 nm to 595 nm or emitting green light with a peak emission wavelength which is from 500 nm to 560 nm and red light with a peak emission wavelength which is from 610 nm to 750 nm, the light-emitting element 102*c* can emit white light or light that appears to be close to white light.

Even when the first light-emitting layer 106 and the second light-emitting layer 110, which have different emission spectra, are placed side by side, the influence of color separation that is observed in the appearance of separation of the colors of light emitted by the respective light-emitting layers can be ignored in a situation where the light-emitting element 102*c* can be deemed to be a point light source. Further, the first light-emitting layer 106 and the second light-emitting layer 110 do not need to be equal but may be different in film thickness from each other.

As shown in FIG. 9, placing a plurality of light-emitting layers side by side in a horizontal direction allows each of the light-emitting layers to emit light through an electrode on a plane of light emission. That is, although, in a case where the light-emitting layers are stacked in a longitudinal direction, light emitted by the lower light-emitting layer may be absorbed and attenuated by the upper light-emitting layer, the light-emitting element 102*c* of the present embodiment can solve such a problem.

The direction in which the light-emitting element 102*c* emits light can be determined by the configuration of electrodes. For example, when the light-emitting element 102*c* is configured such that the second electrode 109 is a translucent electrode and the first electrode 105 is a light-reflecting electrode, light emitted by the first and second light-emitting layers 106 and 110 can exit from the side of the second electrode 109, which is a translucent electrode.

It should be noted that the emission from a light-emitting element of white light or a spectrum of light that is close to white light may alternatively be achieved by replacing the two light-emitting layers with three light-emitting layers, namely light-emitting layer corresponding to blue light, a light-emitting layer corresponding to green light, and a light-emitting layer corresponding to red light, sandwiched between electrodes and placed side by side with each other as in the structure shown in FIG. 9.

The light-emitting element 102*c* shown in FIG. 9 allows the first light-emitting layer 106 and the second light-emitting layer 110 to have different areas, thus making it possible to adjust color balance according to the areas of the light-emitting layers. For example, the area of the first light-emitting layer 106, which emits blue light with low visibility, may be made larger than the area of the second light-emitting layer 110. Further, the color balance of light that is emitted by the light-emitting element 102*c* can be adjusted by making the area of a light-emitting layer with low current efficiency with respect to emission luminance larger than the area of a light-emitting layer with relatively higher current efficiency.

<Configuration of Pixel>

A configuration of a pixel unit of the image display device according to the present embodiment is described with reference to FIG. 10 and FIG. 11. In the present embodiment, as in the other embodiments, each of the pixels includes a plurality of subpixels.

Figure 10:
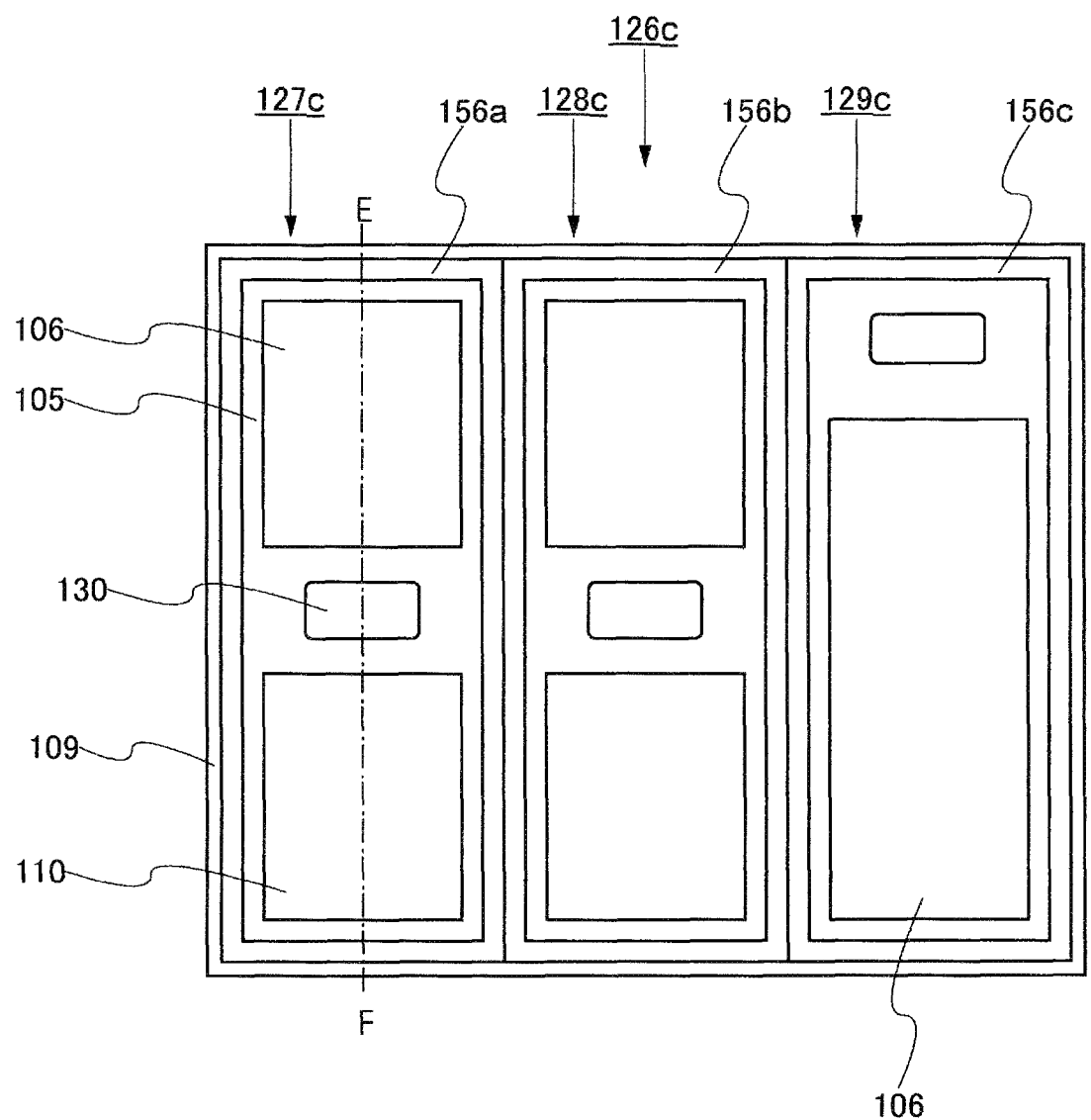
FIG. 10 is a diagram showing a configuration of a pixel of an image display device according to the embodiment of the present invention.

FIG. 10 shows a configuration of a single pixel 126c including a first subpixel 127c, a second subpixel 128c, and a third subpixel 129c. For example, the first subpixel 127c, the second subpixel 128c, and the third subpixel 129c may be subpixels that correspond to the colors of red, green, and blue, respectively. Instead of including only subpixels that correspond to these colors, each pixel may additionally include a subpixel that corresponds to a neutral tint between the aforementioned colors or a subpixel that corresponds to the color of white.

The pixel 126c shown in FIG. 10 is based on a combination of a light-emitting element that emits white light and a color filter, but may be configured such that the third subpixel 129c, which corresponds to the color of blue, is not provided with a color filter 156c. That is, provided the first light-emitting layer 106 emits a band of blue light, the third subpixel 129c may omit to include the second light-emitting layer 110, which emits the light of the complementary color of yellow. According to the present embodiment, since the first light-emitting layer 106, which is provided by using quantum dots, can emit blue light whose emission spectrum has a narrow half-value width and whose color purity is high, there will not be a decrease in color purity even without the use of a color filter. On the contrary, even in a case where the first light-emitting layer 106, which emits light in a band of wavelengths corresponding to the color of blue, is low in emission efficiency, effective use of light can be achieved, as light emitted from the light-emitting layer can be prevented from being absorbed and attenuated by a color filter. This makes it possible to reduce the emission intensity of the first light-emitting layer 106 in the third subpixel 129c, making it possible to reduce deterioration of the light-emitting element.

It should be noted that although FIG. 10 shows an aspect in which the first light-emitting layer 106 and the second light-emitting layer 110 are placed side by side, the placement and array of the light-emitting layers is not limited to this aspect. For example, the light-emitting layers may be divided into a plurality of patterns so that island regions of the first and second light-emitting layers 106 and 110 are alternately arrayed.

Figure 11:
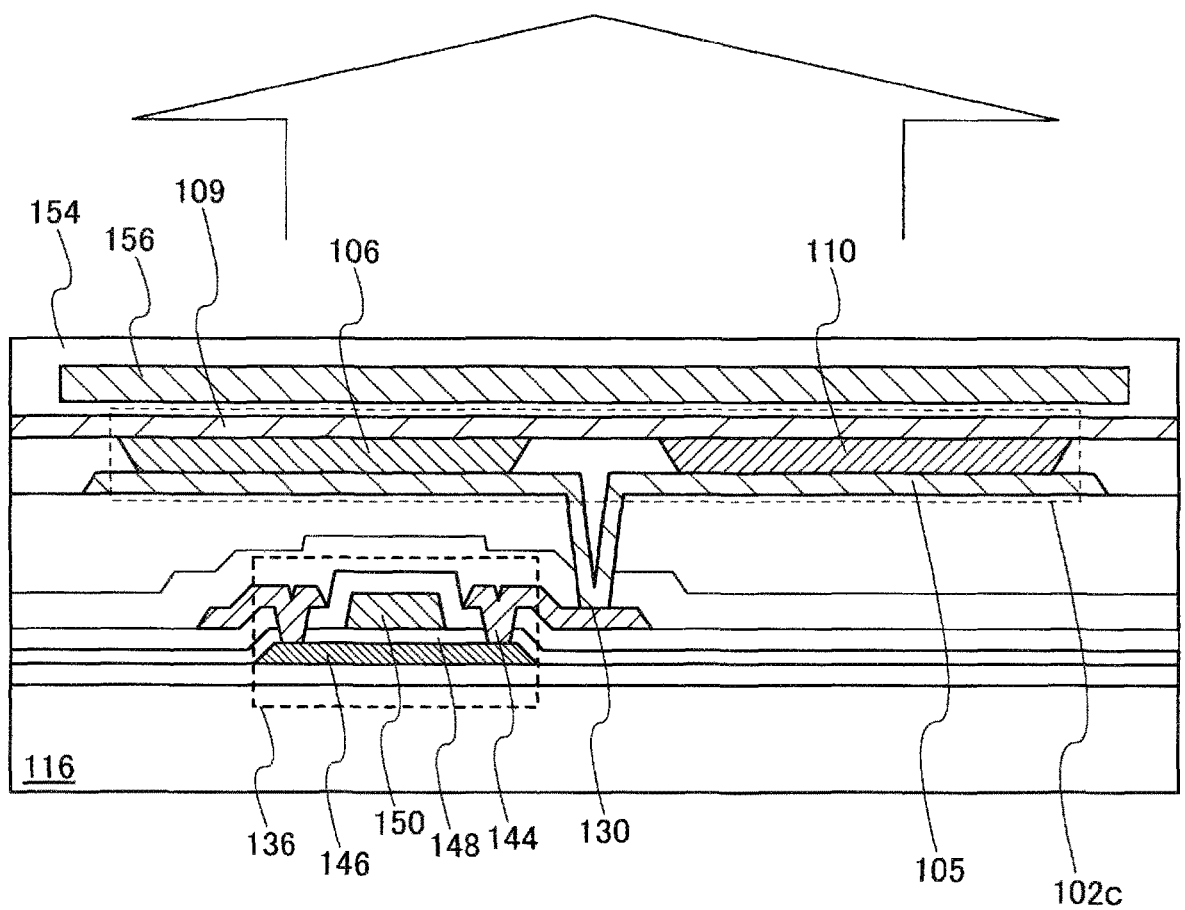
FIG. 11 is a cross-sectional view showing the configuration of the pixel of the image display device according to the embodiment of the present invention.

FIG. 11 shows a cross-sectional structure of such a pixel. The cross-sectional structure of the pixel shown in FIG. 11 corresponds to line E-F shown in FIG. 10.

As shown in FIG. 11, the light-emitting element 102c is connected to the first transistor 136 at the first contact portion 130. The light-emitting element 102c is configured such that the first light-emitting layer 106 and the second light-emitting layer 110 are placed side by side on the first electrode 105. Such an array of light-emitting layers can be achieved by forming the first light-emitting layer 106 and the second light-emitting layer 110 in sequence after forming the first electrode 105.

In the present embodiment, the light-emitting layers can be formed into fine patterns, for example, by photolithographic mask formation and etching processing, as the light-emitting layers are made of an inorganic material using quantum dots. This makes it possible to form the light-emitting layers in fine patterns on each subpixel (on the first electrode 105).

The second electrode 109 is provided on the light-emitting layers and, furthermore, entirely covered with the sealing layer 154. Moreover, providing the color filter 156 on the plane of emission of light allows light in a predetermined wavelength band to be outputted as emitted light. Even in a case where the color filter 156 is provided, the first light-emitting layer 106 and the second light-emitting layer 110 will not be damaged, as the light-emitting layers are formed from quantum dots made of an inorganic material. The present embodiment makes it possible to provide the element substrate 116, on which the light-emitting element 102c is formed, with the color filter 156, thus making it possible to achieve reductions in thickness and weight of the image display device.

The present embodiment makes it possible to place a plurality of quantum dot-based light-emitting layers side by side on the first electrode. By having different emission spectra, the plurality of light-emitting layers provided on the first electrode can form a subpixel that emits white light or light that can be deemed to be pseudo-white light. In this case, a chromaticity adjustment can be made by causing the individual light-emitting layers to have different areas.

Figure 12A:
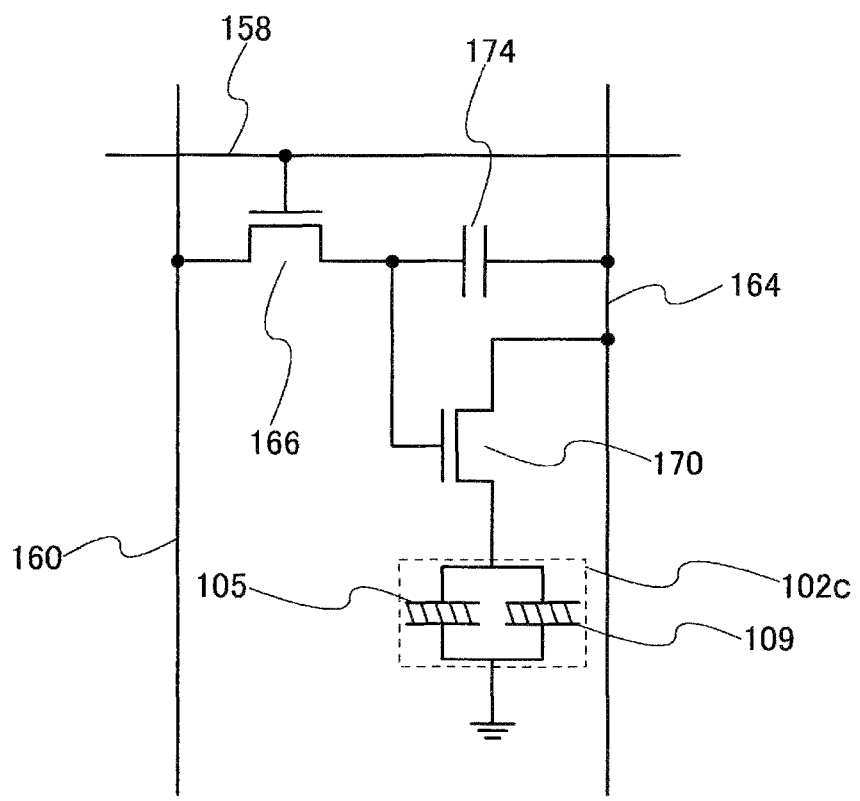
FIG. 12A is a diagram illustrating an example of an equivalent circuit of a pixel of the image display device according to the embodiment of the present invention.
Figure 12B:
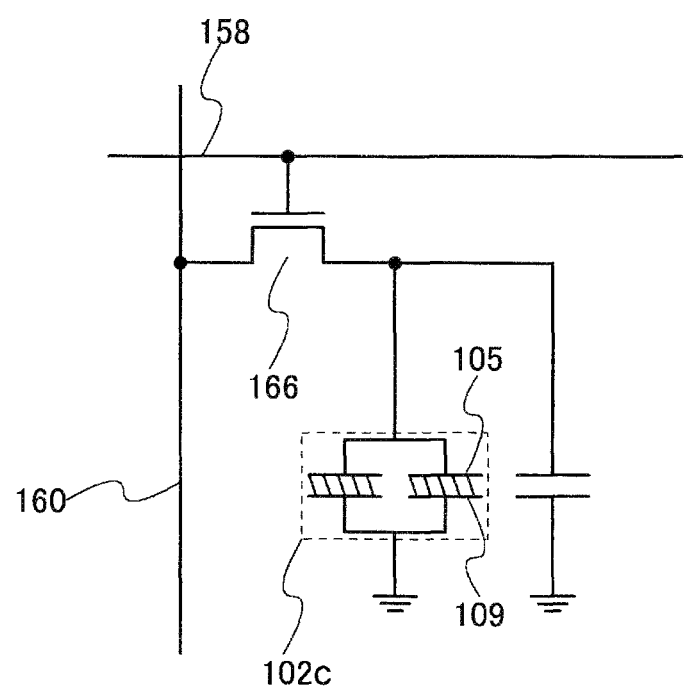
FIG. 12B is a diagram illustrating an example of an equivalent circuit of a pixel of the image display device according to the embodiment of the present invention.

FIG. 12A and FIG. 12B are circuit diagrams showing examples of circuit configurations of pixels, such as that shown in FIG. 11, each of which includes the light-emitting element 102c and a transistor(s).

The circuit shown in FIG. 12A is similar to that shown in FIG. 5A in terms of the connection between the first selecting transistor 166, the first driving transistor 170, the first capacitor 174, and the light-emitting element 102c. However, the light-emitting element 102c has its first and second light-emitting layers 106 and 110 connected to the first driving transistor 170 in parallel to each other. Therefore, the drain current of the driving transistor is divided into different flows according to the characteristics of the first and second light-emitting layers 106 and 110.

The circuit shown in FIG. 12B is similar to that shown in FIG. 5B in terms of the connection between the first selecting transistor 166, the first capacitor 174, and the light-emitting element 102c. The first electrode 105 of the light-emitting element 102c is connected to the first selecting transistor 166 and the first capacitor 174, and a common potential is supplied to the second electrode 109. Therefore, when a predetermined potential that is higher than the common potential is supplied to the first capacitor 174, the charges are supplied from the first capacitor 174 to the light-emitting element 102c, so that the light-emitting element 102c can emit light.

As described above, by forming light-emitting layers from quantum dots, the present embodiment makes it possible to place the plurality of light-emitting layers side by side on the same electrode. In this case, the plurality of light-emitting layers, which have different emission spectra, can have different areas. This makes it possible to adjust the color tone by changing the area ratio between the plurality of light-emitting layers. Further, since a light-emitting element that emits white light can be made by a combination of the plurality of light-emitting layers having different emission wavelengths, an image display device that performs a color display can be achieved by providing a color filter on the plane of light emission of each of the pixels.

Fourth Embodiment

The present embodiment shows an aspect of a light-emitting element configured such that a plurality of light-emitting layers are arranged in a transverse direction (horizontal direction) and the emission of light by the light-emitting layers can be individually controlled and an image display device whose pixels are constituted by the light-emitting element.

<Structure of Light-Emitting Element>

Figure 13:
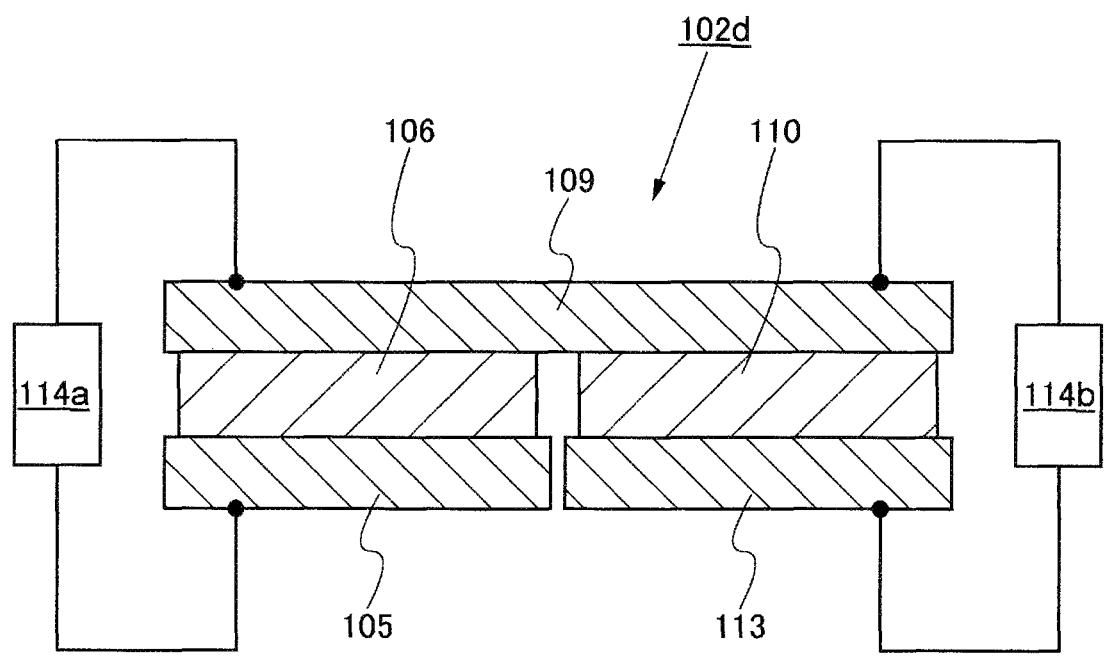
FIG. 13 is a diagram illustrating a configuration of a light-emitting element according to an embodiment of the present invention.

FIG. 13 shows a configuration of a light-emitting element 102d constituting pixels of an image display device according to an embodiment of the present invention. The light-emitting element 102d is configured such that the first light-emitting layer 106 is provided between the first electrode 105 and the second electrode 109 and the second light-emitting layer 110 is provided between a third electrode 113 and the second electrode 109. That is, the light-emitting element 102d is configured such that the first electrode 105 is provided in correspondence with the first light-emitting layer 106 and the third electrode 113 is provided in correspondence with the second light-emitting layer 110, with the second electrode 109 shared in common.

That is, the light-emitting element 102d according to the present embodiment differs from the light-emitting element according to the third embodiment in that each of the light-emitting layers placed side by side is sandwiched between an electrode and one of divided electrodes provided in correspondence to the respective light-emitting layers. This difference allows the light-emitting element 102d illustrated in FIG. 13 to individually control the emission of light by the first and second light-emitting layers 106 and 110. In FIG. 13, the first and second electrodes 105 and 109, between which the first light-emitting layer 106 is sandwiched, are connected to a first driving power source 114a, and the third and second electrodes 113 and 109, between which the second light-emitting layer 110 is sandwiched, are connected to a second driving power source 114b. In this case, the light-emitting element 102d can emit light with a difference in driving voltage between the first driving power source 114a and the second driving power source 114b. Further, the light-emitting element 102d can emit light only through one of the light-emitting layers while emitting no light through the other one of the light-emitting layers.

It should be noted that the first light-emitting layer 106 and the second light-emitting layer 110 are identical in configuration to those described in the first embodiment. That is, by the first light-emitting layer 106 emitting blue light with a peak emission wavelength which is from 435 nm to 480 nm and the second light-emitting layer 110 emitting yellow light with a peak emission wavelength which is from 580 nm to 595 nm or emitting green light with a peak emission wavelength which is from 500 nm to 560 nm and red light with a peak emission wavelength which is from 610 nm to 750 nm, the light-emitting element 102d can emit white light or light that appears to be close to white light. It should be noted that the combination of these light-emitting layers may be replaced by three light-emitting layers, namely light-emitting layer corresponding to blue light, a light-emitting layer corresponding to green light, and a light-emitting layer corresponding to red light.

The direction in which the light-emitting element 102d emits light can be determined by the configuration of electrodes. For example, when the light-emitting element 102d is configured such that the second electrode 109 is a translucent electrode and the first electrode 105 and the third electrode 113 are light-reflecting electrodes, light emitted by the first and second light-emitting layers 106 and 110 can exit from the side of the second electrode 109, which is a translucent electrode.

As with the light-emitting element in the third embodiment, the light-emitting element 102d of the present embodiment allows the first light-emitting layer 106 and the second light-emitting layer 110 to have different areas, thus making it possible to adjust color balance according to the areas of the light-emitting layers.

<Configuration of Pixel>

A configuration of a pixel unit of the image display device according to the present embodiment is described with reference to FIG. 14 and FIG. 15. In the present embodiment, as in the other embodiments, each of the pixels includes a plurality of subpixels.

Figure 14:
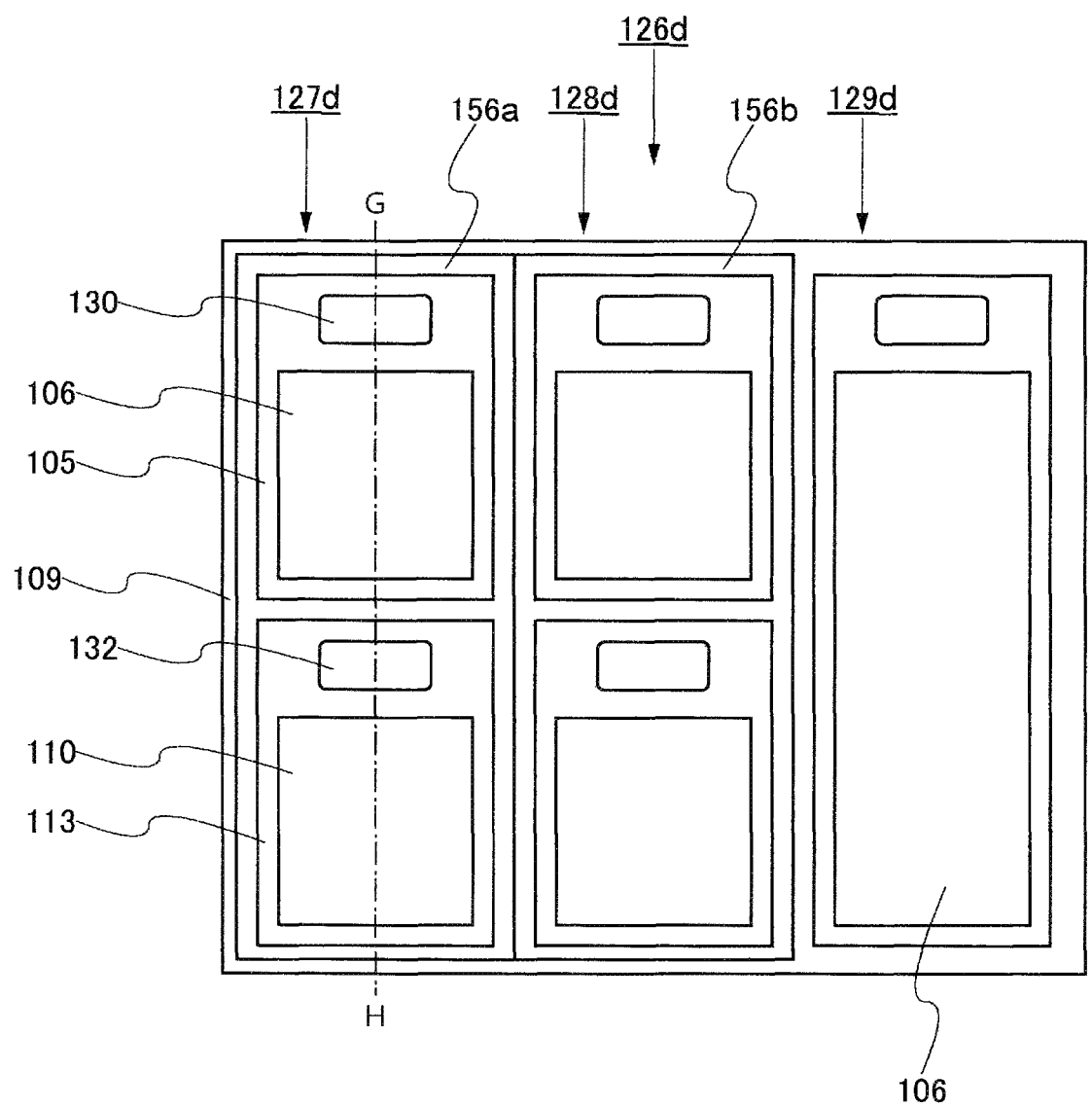
FIG. 14 is a diagram showing a configuration of a pixel of an image display device according to the embodiment of the present invention.

FIG. 14 shows a configuration of a single pixel 126d including a first subpixel 127d, a second subpixel 128d, and a third subpixel 129d, as in Embodiment 3. Further, the third subpixel 129d, which corresponds to the color of blue, is not provided with a color filter.

Figure 15:
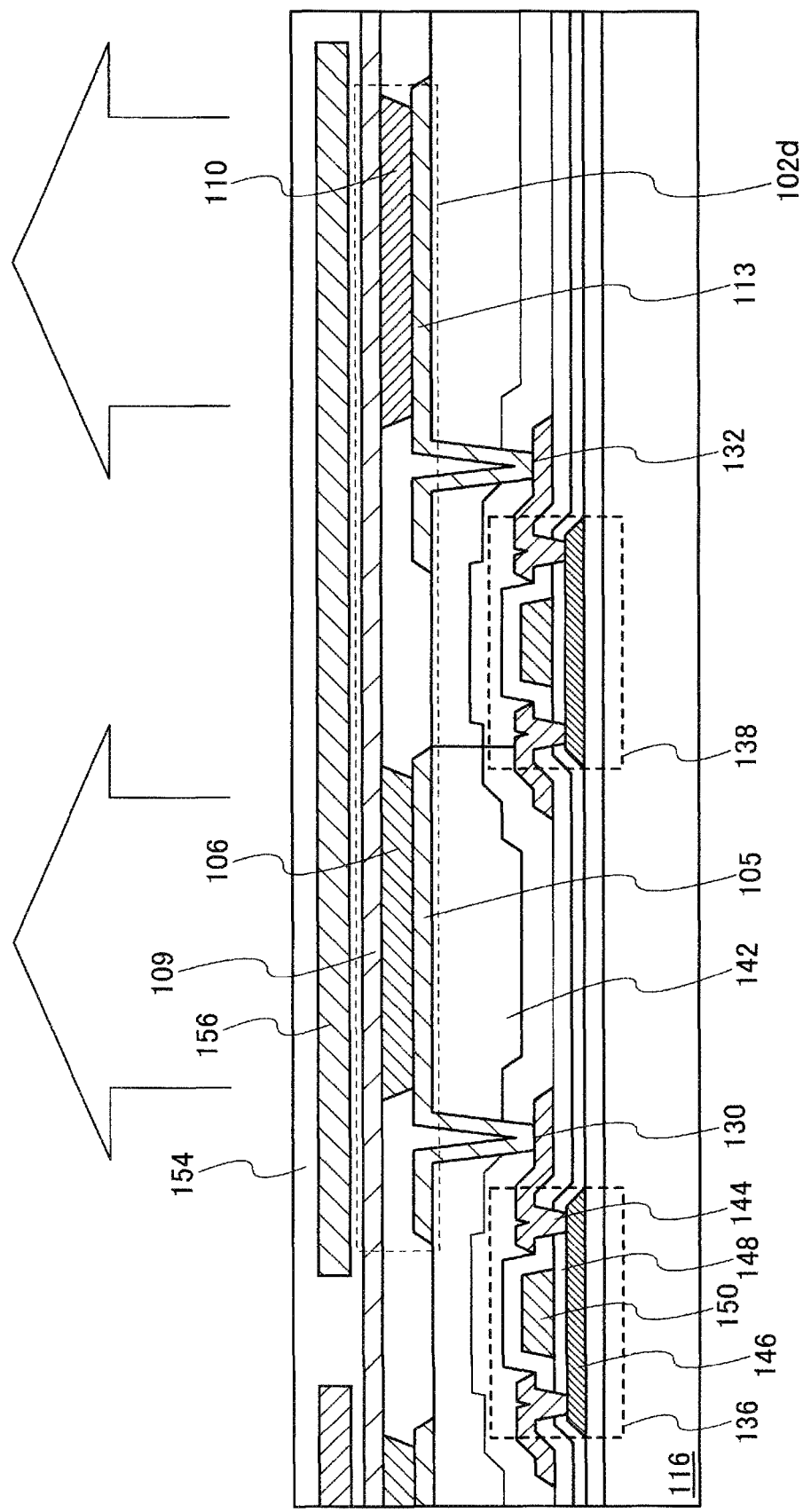
FIG. 15 is a cross-sectional view showing the configuration of the pixel of the image display device according to the embodiment of the present invention.

FIG. 15 shows a cross-sectional structure of such a pixel. The cross-sectional structure of the pixel shown in FIG. 15 corresponds to line E-F shown in FIG. 14.

As shown in FIG. 15, the first electrode 105 of the light-emitting element 102d is connected to the first transistor 136 at the first contact portion 130, and the third electrode 113 of the light-emitting element 102d is connected to the second transistor 138 at the second contact portion 132. Since the second electrode 109 is supplied with a common potential (e.g. a ground potential), the first transistor 136 and the second transistor 138 allow the first light-emitting layer 106 and the second light-emitting layer 110 to emit light with individually different potentials applied to them.

It should be noted that, in the present embodiment, the first electrode 105 and the third electrode 113 are light-reflecting electrodes and the second electrode 109 is an optically transparent electrode. Therefore, the second electrode 109 serves as a plane of light emission, and by providing a color filter 156 on a side that faces the upper surface of the second electrode 109, the subpixel can be made to emit light in a particular band. In this case, even when a plurality of light-emitting layers that emit light in different wavelength bands are placed side by side, the influence of color separation that is observed in the appearance of separation of the colors of light can be ignored, provided each subpixel can be deemed to be a point light source.

The present embodiment makes it possible to, by placing a plurality of quantum dot-based light-emitting layers side by side and individually controlling the emission of light, form a subpixel that emits white light or light that can be deemed to be pseudo-white light. In this case, a chromaticity adjustment can be made by applying different potentials to the respective light-emitting layers.

Figure 16A:
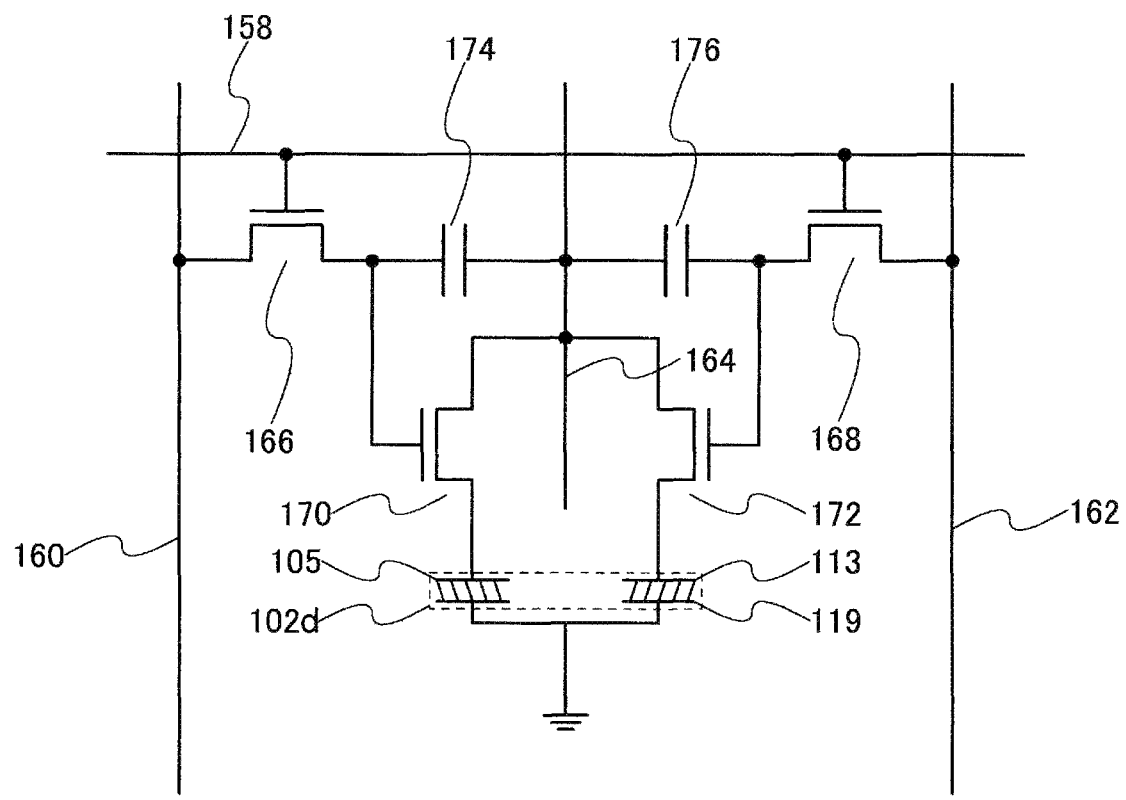
FIG. 16A is a diagram illustrating an example of an equivalent circuit of a pixel of the image display device according to the embodiment of the present invention.
Figure 16B:
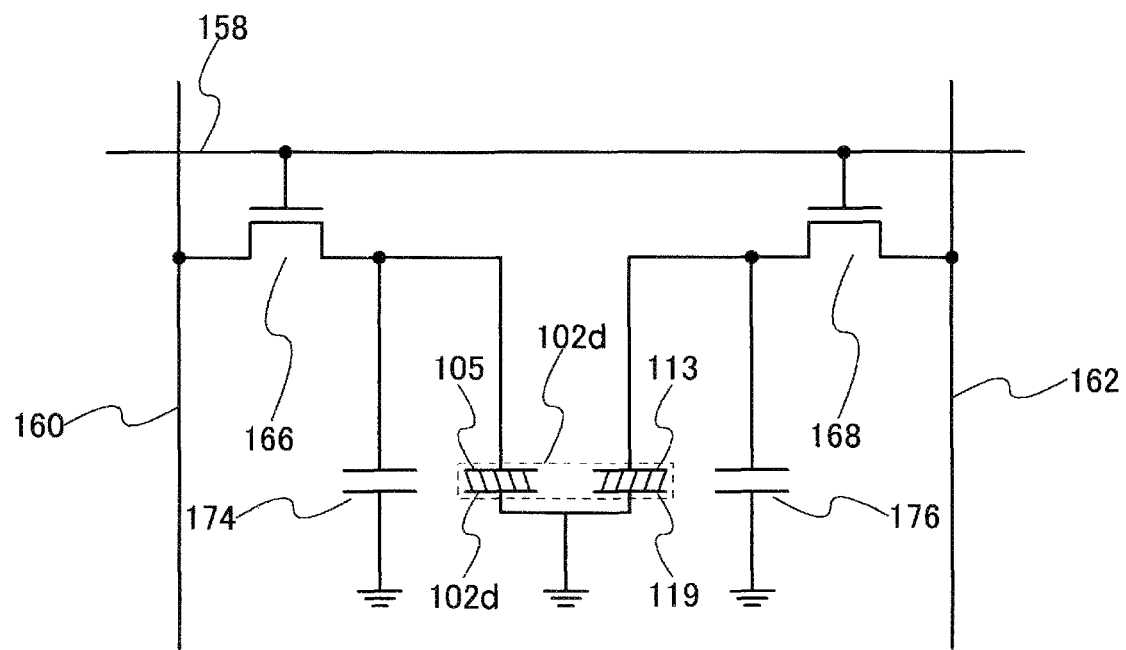
FIG. 16B is a diagram illustrating an example of an equivalent circuit of a pixel of the image display device according to the embodiment of the present invention.

FIG. 16A and FIG. 16B are circuit diagrams showing examples of circuit configurations of pixels, such as that shown in FIG. 15, each of which includes the light-emitting element 102d and a transistor(s).

The circuit shown in FIG. 16A is similar to that shown in FIG. 5A in terms of the connection between the first selecting transistor 166, the first driving transistor 170, the first capacitor 174, and the light-emitting element 102d. The circuit shown in FIG. 16A is also similar to that shown in FIG. 5A in terms of the connection between the second selecting transistor 168, the second driving transistor 172, the second capacitor 176, and the light-emitting element 102d. However, the circuit shown in FIG. 16A is differs from that shown in FIG. 5A in that the first driving transistor 170 is connected to the first electrode 105 of the light-emitting element 102d and the second driving transistor 172 is connected to the third electrode 113. Further, the first selecting transistor 166 is connected to the first video signal line 160, the second selecting transistor 168 is connected to the second video signal line 162, and the first driving transistor 170 and the second driving transistor 172 are both connected to the power source line 164.

Supplying different video signals to the first video signal line 160 and the second video signal line 162 with such a circuit configuration makes it possible to individually control the potential that is applied to the first electrode 105 (i.e. the current flowing through the first light-emitting layer 106) and the potential that is applied to the third electrode 113 (i.e. the current flowing through the second light-emitting layer 110).

The circuit shown in FIG. 16B is similar to that shown in FIG. 5B in terms of the connection between the first selecting transistor 166, the first capacitor 174, and the light-emitting element 102*d* and the connection between the second selecting transistor 168, the second capacitor 176, and the light-emitting element 102*d*.

The first electrode 105 of the light-emitting element 102*d* is connected to the first selecting transistor 166 and the first capacitor 174, the third electrode 113 is connected to the second selecting transistor 168 and the second capacitor 176, and a common potential is supplied to the second electrode 109. With this, when a predetermined potential that is higher than the common potential is supplied to the first capacitor 174, the potential difference between the first electrode 105 and the second electrode 109 allows the first light-emitting layer 106 to emit light. The same applies to the second light-emitting layer 110.

As described above, by forming light-emitting layers from quantum dots, the present embodiment makes it possible to place the plurality of light-emitting layers side by side on the same electrode. Moreover, by providing individual electrodes in correspondence with the respective light-emitting layers, the emission of light from each separate light-emitting layer can be controlled. In this case, the emission intensity of each separate light-emitting layer can be controlled by the potentials that are applied to each separate electrode. This makes it possible to vary the emission intensity and thereby adjust the color tone. Further, since a light-emitting element that emits white light can be made by a combination of the plurality of light-emitting layers having different emission wavelengths, an image display device that performs a color display can be achieved by providing a color filter on the plane of light emission of each of the pixels. It should be noted that the present embodiment is the same as the third embodiment except that the third electrode is provided, the present embodiment can bring about effects which are similar to those brought about by the third embodiment. It should be noted that, although not illustrated, the emission intensities of light-emitting parts that correspond to each separate electrode can also be adjusted by controlling the length of light-emitting time by using an appropriate circuit with fixed potentials applied to each separate electrode.

REFERENCE SIGNS LIST

100 . . . image display device, 102 . . . light-emitting element, 104 . . . first electrode, 105 . . . first electrode, 106 . . . first light-emitting layer, 108 . . . second electrode, 109 . . . second electrode, 110 . . . second light-emitting layer, 112 . . . third electrode, 113 . . . third electrode, 114 . . . driving power source, 116 . . . element substrate, 118 . . . sealant, 120 . . . driver circuit, 122 . . . flexible printed wiring board, 124 . . . pixel unit, 126 . . . pixel, 127 . . . first subpixel, 128 . . . second subpixel, 129 . . . third subpixel, 130 . . . first contact portion, 132 . . . second contact portion, 134 . . . third contact portion, 136 . . . first transistor, 138 . . . second transistor, 140 . . . wire, 142 . . . interlayer insulating layer, 144 . . . source-drain electrode, 146 . . . semiconductor layer, 148 . . . gate insulating layer, 150 . . . gate electrode, 152 . . . bank layer, 154 . . . sealing layer, 156 . . . color filter, 158 . . . scanning signal line, 160 . . . first video signal line, 162 . . . second video signal line, 164 . . . power source line, 166 . . . first selecting transistor, 168 . . . second selecting transistor, 170 . . . first driving transistor, 172 . . . second driving transistor, 174 . . . first capacitor, 176 . . . second capacitor

The invention claimed is:

1. An image display device comprising:
    a pixel region where pixels each including a plurality of subpixels are two-dimensionally arrayed,
    wherein each of the subpixels includes a plurality of light-emitting layers overlapping each other with an electrode sandwiched therebetween,
    the plurality of light-emitting layers each contain a quantum dot material and have different peak emission wavelengths from other,
    each of the subpixels includes a first light-emitting layer provided between a first electrode and a second electrode,
    a second light-emitting layer provided between the second electrode and a third electrode located on a side of the second electrode opposite to the first electrode,
    the first electrode is connected to a source-drain electrode of a first transistor,
    the third electrode is connected to a source-drain electrode of a second transistor,
    a first video signal supplied from a first video signal line is inputted to a gate electrode of the first transistor, and
    a second video signal supplied from a second video signal line is inputted to a gate electrode of the second transistor.

2. The image display device according to claim 1, wherein the first light-emitting layer emits light with a peak emission wavelength which is from 435 nm to 480 nm, and
    the second light-emitting layer emits yellow light with a peak emission wavelength which is from 580 nm to 595 nm or emits green light with a peak emission wavelength which is from 500 nm to 560 nm and light with a peak emission wavelength which is from 610 nm to 750 nm.

3. The image display device according to claim 1, wherein the first electrode is connected to a source-drain electrode of a first transistor,
    the third electrode is disposed across the subpixels, and
    a common potential is applied to the third electrode.

4. The image display device according to claim 1, further comprising a color filter provided above the light-emitting layers.

5. The image display device according to claim 1, wherein the first electrode has a light-reflecting surface, and
    the second electrode and the third electrode have translucency.

6. The image display device according to claim 1, wherein the light-emitting layers are provided substantially all over the pixel region.

7. The image display device according to claim 1, wherein potentials of the first electrode, the second electrode, and the third electrode are individually controlled.

8. The image display device according to claim 1, wherein potentials of the first electrode and the third electrode are individually controlled, and
    the second electrode is at a floating potential.

9. An image display device comprising:
a pixel region where pixels each including a plurality of subpixels are two-dimensionally arrayed,
wherein at least one of the subpixels includes a plurality of light-emitting layers placed side by side, and
the plurality of light-emitting layers each contain a quantum dot material and have different peak emission wavelengths from each other.

10. The image display device according to claim 9, wherein each of the pixels includes a first subpixel that corresponds to red, a second subpixel that corresponds to green, and a third subpixel that corresponds to blue,
the first subpixel and the second subpixel are provided with color filters above the light-emitting layers, and
the third subpixel is provided with no color filter.

11. The image display device according to claim 9, wherein the subpixels include a first subpixel in which the plurality of light-emitting layers are placed side by side and a second subpixel that includes a single light-emitting layer containing a quantum dot material.

12. The image display device according to claim 11, wherein the second subpixel emits blue light and is provided with no color filter.

13. The image display device according to claim 9, wherein each of the subpixels includes first and second light-emitting layers placed side by side between a first electrode and a second electrode,
the first electrode is connected to a source-drain electrode of a first transistor,
the second electrode is disposed across the subpixels, and
a common potential is applied to the second electrode.

14. The image display device according to claim 13, wherein the first electrode has a light-reflecting surface, and
the second electrode has translucency.

15. The image display device according to claim 9, wherein each of the subpixels includes a first light-emitting layer provided between a first electrode and a second electrode and a second light-emitting layer provided between a third electrode and the second electrode.

16. The image display device according to claim 15, wherein the first electrode and the third electrode have light-reflecting surfaces, and
the second electrode has translucency.

17. The image display device according to claim 15, wherein potentials of the first electrode, the second electrode, and the third electrode are individually controlled.

18. The image display device according to claim 15, wherein the first electrode is connected to a source-drain electrode of a first transistor,
the third electrode is connected to a source-drain electrode of a second transistor,
a first video signal supplied from a first video signal line is inputted to a gate electrode of the first transistor, and
a second video signal supplied from a second video signal line is inputted to a gate electrode of the second transistor.

* * * * *